(12) United States Patent
Mou et al.

(10) Patent No.: US 11,581,483 B2
(45) Date of Patent: Feb. 14, 2023

(54) MANUFACTURING METHOD OF MICRO FLUID ACTUATOR

(71) Applicant: MICROJET TECHNOLOGY CO., LTD., Hsinchu (TW)

(72) Inventors: Hao-Jan Mou, Hsinchu (TW); Hsien-Chung Tai, Hsinchu (TW); Lin-Huei Fang, Hsinchu (TW); Yung-Lung Han, Hsinchu (TW); Chi-Feng Huang, Hsinchu (TW); Chin-Wen Hsieh, Hsinchu (TW); Tsung-I Lin, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 101 days.

(21) Appl. No.: 17/249,839

(22) Filed: Mar. 16, 2021

(65) Prior Publication Data

US 2021/0296567 A1   Sep. 23, 2021

(30) Foreign Application Priority Data

Mar. 19, 2020   (TW) .................................. 109109284

(51) Int. Cl.
*H01L 41/23* (2013.01)
*H01L 41/314* (2013.01)
(Continued)

(52) U.S. Cl.
CPC ............ *H01L 41/23* (2013.01); *B81B 3/0021* (2013.01); *B81C 1/00158* (2013.01); *B81C 1/00531* (2013.01); *B81C 1/00539* (2013.01); *F04B 43/046* (2013.01); *F16K 99/0048* (2013.01); *H01L 41/0973* (2013.01); *H01L 41/314* (2013.01); *H01L 41/332* (2013.01);
(Continued)

(58) Field of Classification Search
None
See application file for complete search history.

(56) References Cited

U.S. PATENT DOCUMENTS

2010/0295138 A1   11/2010   Montanya et al.
2019/0063417 A1   2/2019   Mou et al.
2020/0139368 A1   5/2020   Mou et al.

OTHER PUBLICATIONS

A. De Pastina et al., "Fabrication of Suspended Microchannel Resonator with Integrated Piezoelectric Transduction", Microelectronic Engineering, vol. 192, pp. 83-87. (Year: 2018).*

* cited by examiner

*Primary Examiner* — Jiong-Ping Lu
(74) *Attorney, Agent, or Firm* — McClure, Qualey & Rodack, LLP

(57) ABSTRACT

A manufacturing method of micro fluid actuator includes: providing a substrate; depositing a first protection layer on a first surface of the substrate; depositing an actuation region on the first protection layer; applying lithography dry etching to a portion of the first protection layer to produce at least one first protection layer flow channel; applying wet etching to a portion of a main structure of the substrate to produce a chamber body and a first polycrystalline silicon flow channel region, while a region of an oxidation layer middle section of the main structure is not etched; applying reactive-ion etching to a portion of a second surface of the substrate to produce at least one substrate silicon flow channel; and applying dry etching to a portion of a silicon dioxide layer to produce at least one silicon dioxide flow channel.

9 Claims, 31 Drawing Sheets

(51) Int. Cl.
  *B81C 1/00* (2006.01)
  *H01L 41/09* (2006.01)
  *F16K 99/00* (2006.01)
  *B81B 3/00* (2006.01)
  *F04B 43/04* (2006.01)
  *H01L 41/332* (2013.01)
(52) U.S. Cl.
  CPC ... *B81B 2201/032* (2013.01); *B81B 2201/054* (2013.01); *B81B 2201/058* (2013.01); *B81B 2203/053* (2013.01); *F16K 2099/0074* (2013.01)

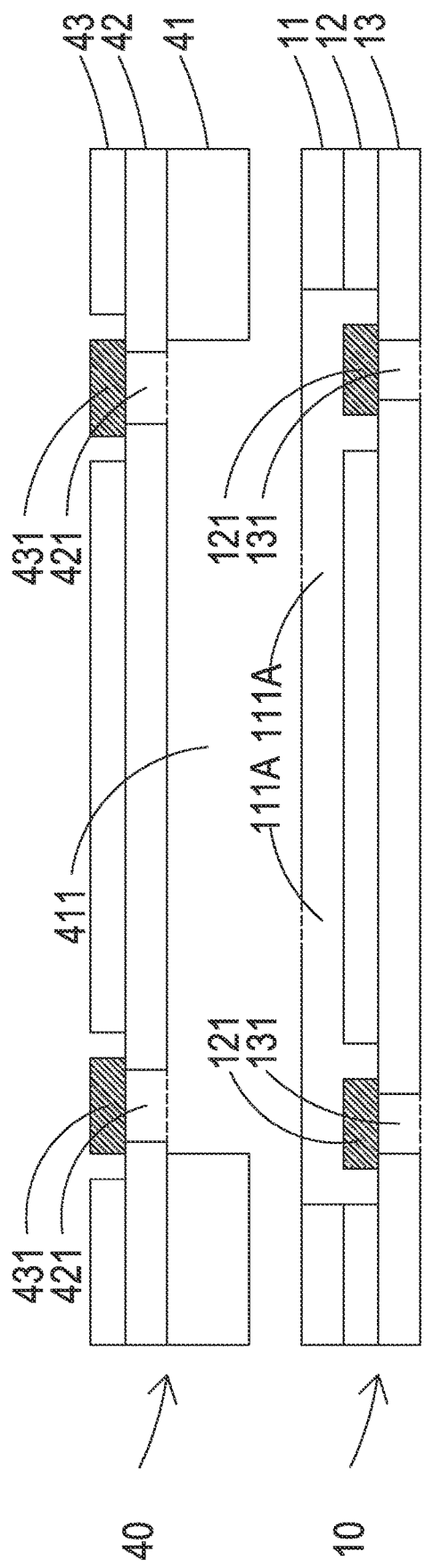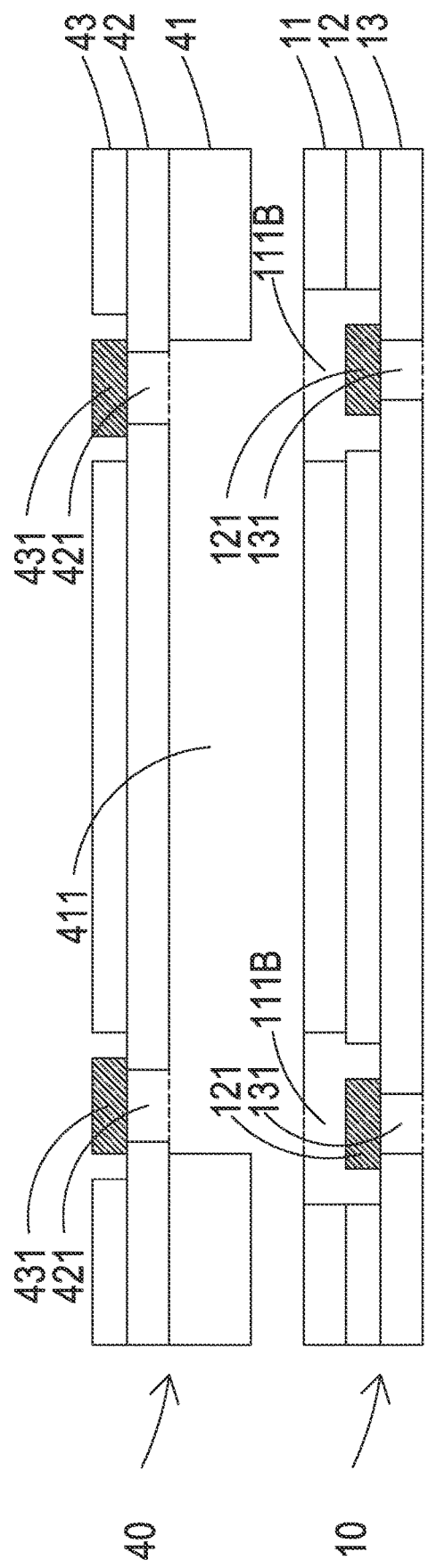
FIG. 2A
FIG. 2B

MANUFACTURING METHOD OF MICRO FLUID ACTUATOR

CROSS-REFERENCE TO RELATED APPLICATION

This non-provisional application claims priority under 35 U.S.C. § 119(a) to Patent Application No. 109109284 filed in Taiwan, R.O.C. on Mar. 19, 2020, the entire contents of which are hereby incorporated by reference.

BACKGROUND

Technical Field

The present disclosure relates to a manufacturing method of micro fluid actuator. In particular, to a manufacturing method of micro fluid actuator using 1P6M (P for ploy layer, and M for metal layer) process or 2P4M (P for ploy layer, and M for metal layer) process as well as microelectromechanical systems (MEMS) process.

Related Art

With the rapid developments of technology, the application of fluid transport devices is becoming much more diversified. It can be seen in industrial applications, biomedical applications, medical cares, electronic heat dissipation devices, etc., and even in wearable devices, which attracts a lot of attention recently. Thus, it can be understood that there is a trend that the sizes of traditional gas transmission devices have gradually become smaller and the fluid transporting capacities of the gas transmission devices have become larger. Thereby, the demand of thin gas transmission devices began to arise.

However, although existing micro fluid actuators are improved continuously for miniaturization, sizes of the pumps still cannot be reduced to be the micrometer scale from the millimeter scale. Therefore, how to reduce the size of the pump to micrometer scale is a main issue of the present disclosure.

SUMMARY

One object of the present disclosure is to provide a manufacturing method of micro fluid actuator through 1P6M process or 2P4M process. The micro fluid actuator is manufactured by a semiconductor thin film for fluid transmission. Therefore, when the depth of the thin film chamber is controlled in a shallow condition, the fluid compression ratio for the operation of the fluid micro actuator can still be increased.

A general embodiment of the present disclosure provides a manufacturing method of micro fluid actuator includes following steps: providing a substrate, wherein the substrate is a substrate applied with a 1P6M (one ploy layer and six metal layers) process; depositing a first protection layer on a first surface of the substrate; depositing an actuation region on the first protection layer, wherein a plurality of steps for forming the actuation region includes sequentially depositing a lower electrode layer, depositing a piezoelectric actuation layer, and depositing an upper electrode layer; and applying lithography dry etching to a portion of the first protection layer to produce at least one first protection layer flow channel.

BRIEF DESCRIPTION OF THE DRAWINGS

The disclosure will become more fully understood from the detailed description given herein below for illustration only, and thus is not limitative of the disclosure, wherein:

FIGS. 2A and 2B illustrate schematic views of a lower valve region and an upper valve region of the micro fluid actuator of different implementations of the present disclosure;

DETAILED DESCRIPTION

Figure 1A:
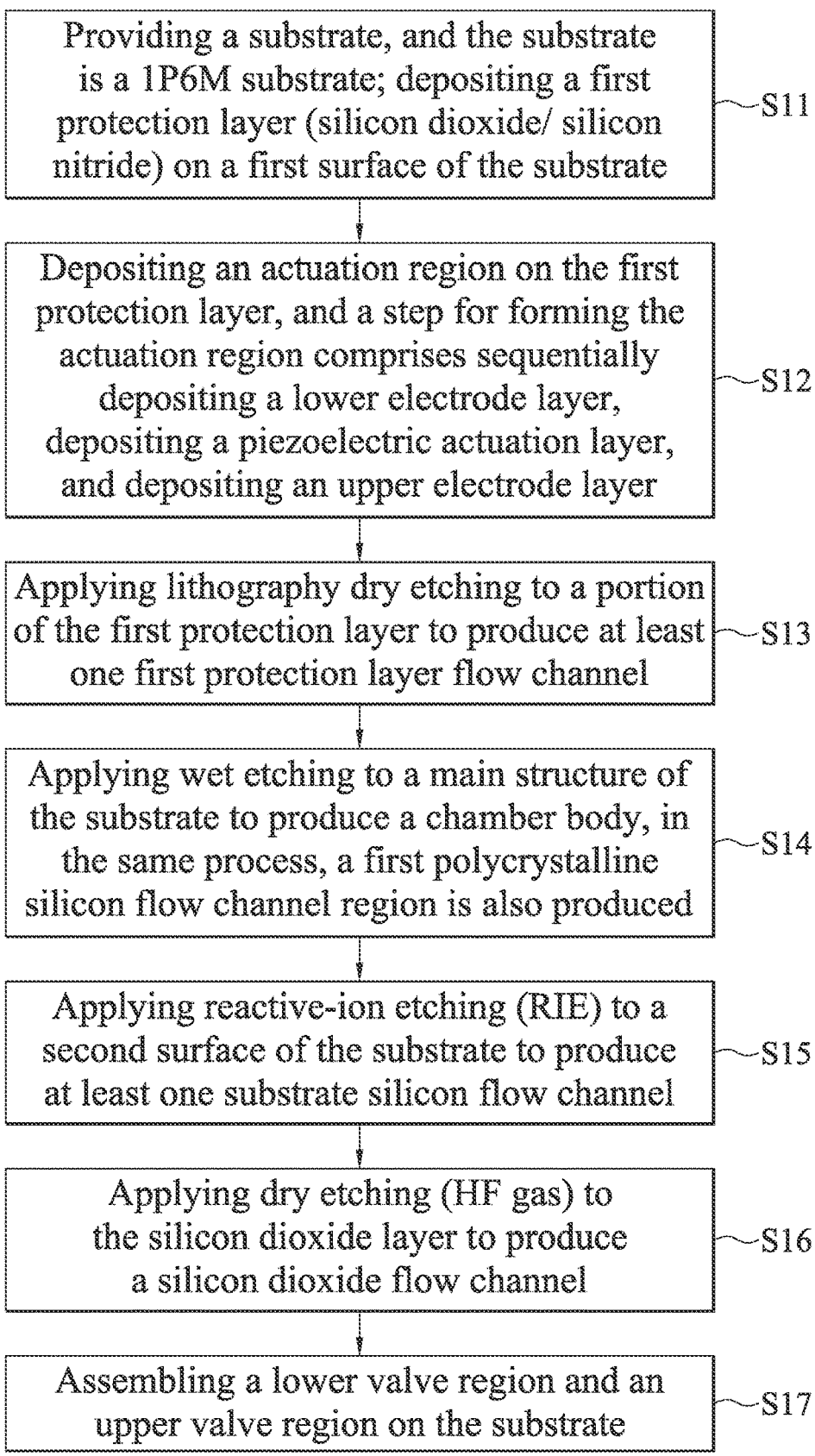
FIGS. 1A to 1C illustrate flowcharts of manufacturing methods of micro fluid actuator according to embodiments of the present disclosure.
Figure 1B:
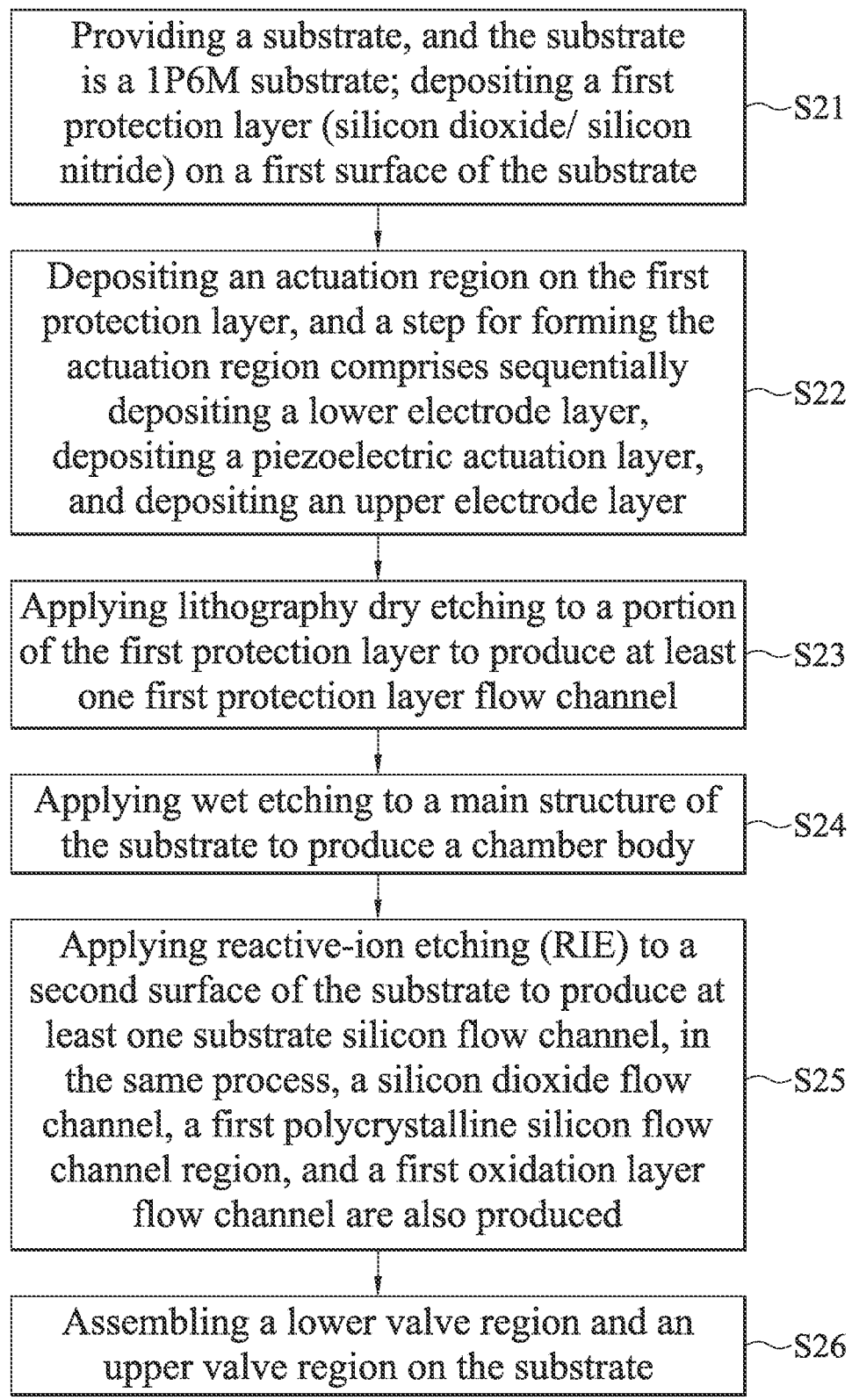
Figure 1C:
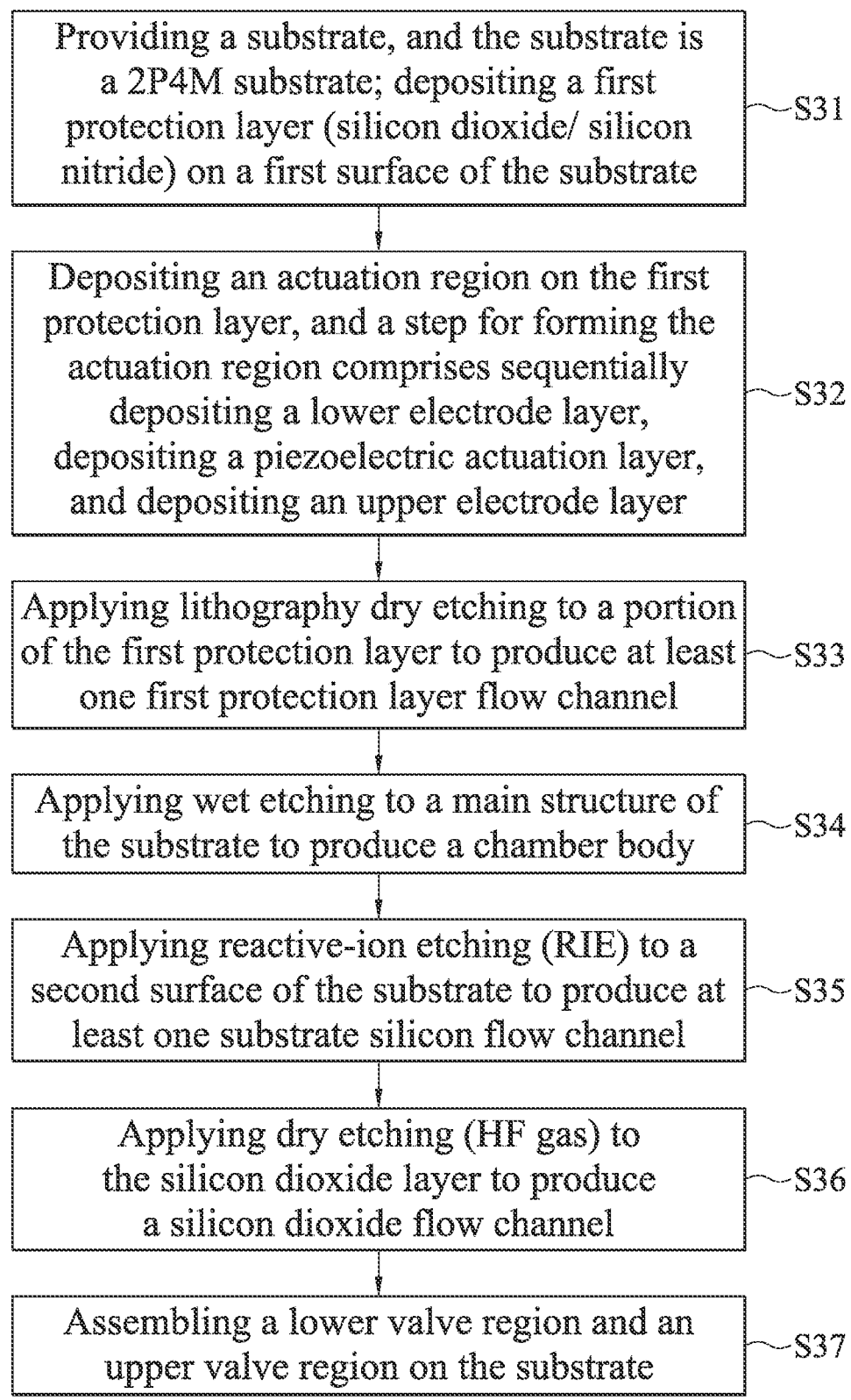
Figure 3A:
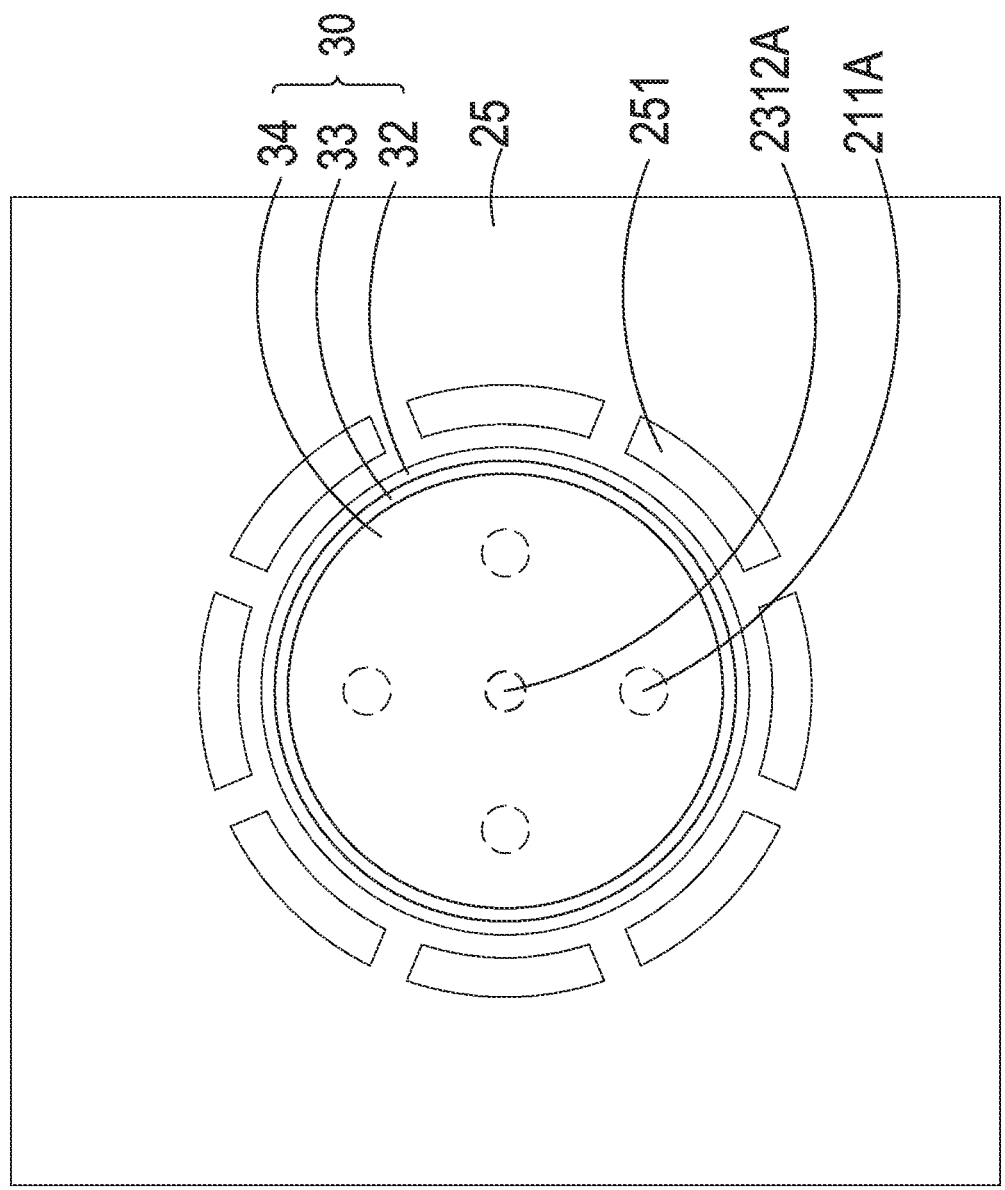
FIGS. 3A to 3C illustrate perspective views of an actuation area and a main area of the micro fluid actuator of different implementations of the present disclosure.
Figure 3B:
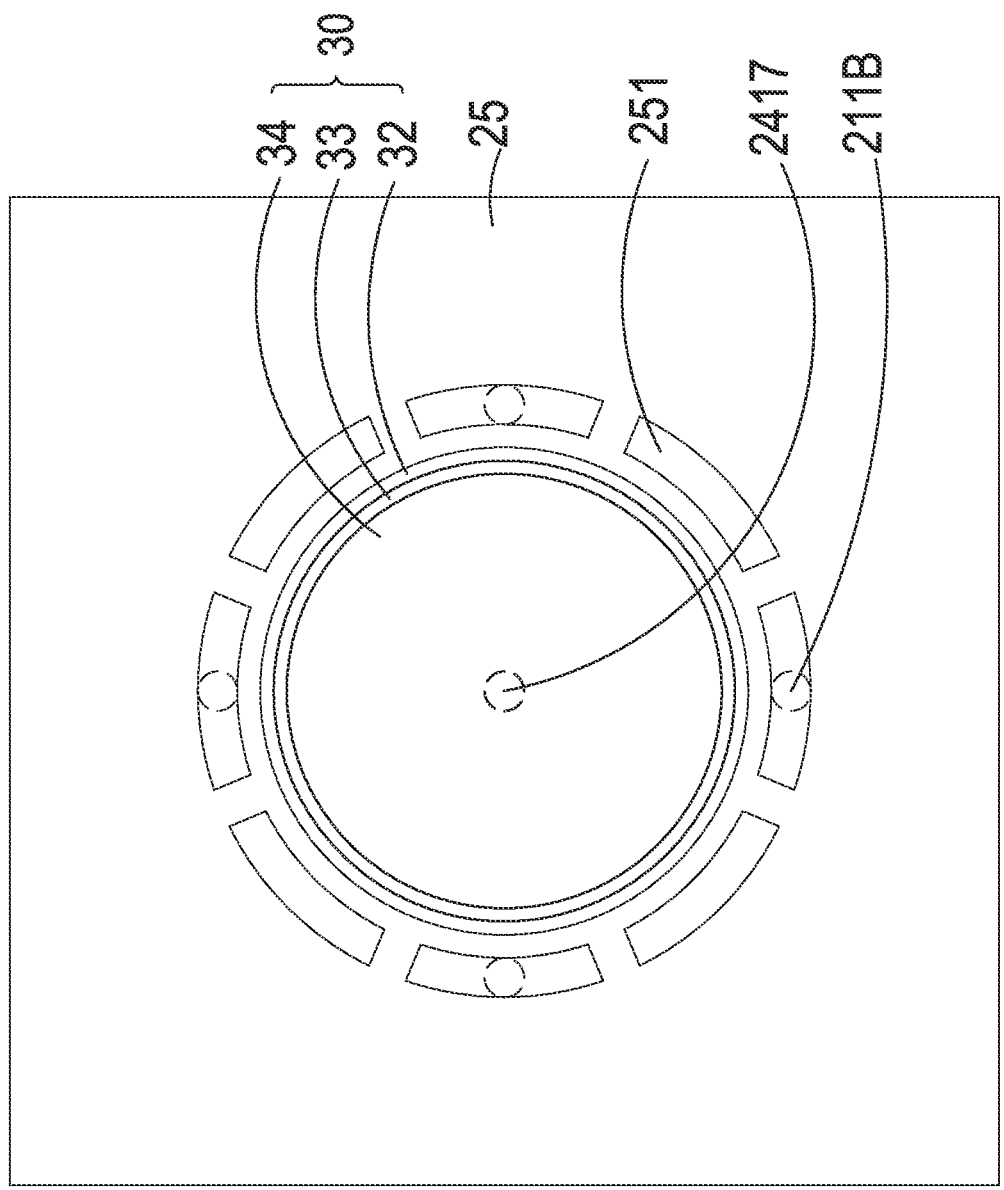
Figure 3C:
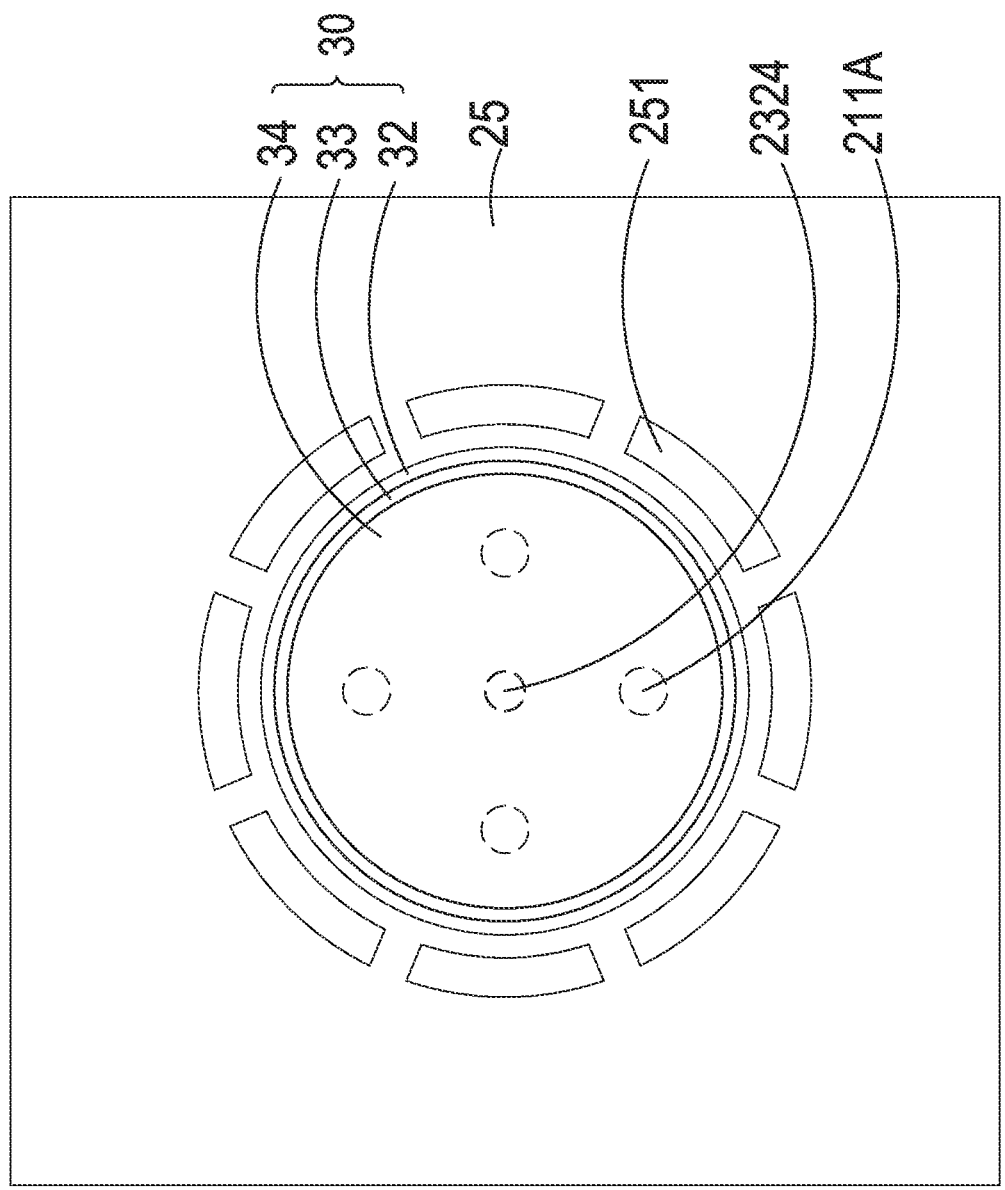

The present disclosure will now be described more specifically with reference to the following embodiments. It is to be noted that the following descriptions of different embodiments of this disclosure are presented herein for purpose of illustration and description only, and it is not intended to limit the scope of the present disclosure.

A manufacturing method of micro fluid actuator includes following steps: providing a substrate 21, and the substrate 21 is a substrate applied with a 1P6M (one ploy layer and six metal layers) process; depositing a first protection layer 25 on a first surface of the substrate 21; depositing an actuation region 30 on the first protection layer 25, and the steps for forming the actuation region 30 include sequentially depositing a lower electrode layer 32, depositing a piezoelectric actuation layer 33, and depositing an upper electrode layer 34; and applying lithography dry etching to a portion of the first protection layer 25 to produce at least one first protection layer flow channel 251. In some embodiments, the manufacturing method further includes following steps: applying wet etching to a portion of a main structure 24A of the substrate 21 to produce a chamber body 26 and a first polycrystalline silicon flow channel region 2312A, while a region of a 1P6M oxidation layer middle section 2414 of the main structure 24A is not etched; applying reactive-ion etching (RIE) to a portion of a second surface of the substrate 21 to produce at least one substrate silicon flow channel 211A; and applying dry etching to a portion of a silicon dioxide layer 22 to produce at least one silicon dioxide flow channel 221A. In some embodiments, the manufacturing method further includes following steps: assembling a lower valve region 10 under the second surface of the substrate 21 and assembling an upper valve region 40 on the first protection layer 25.

Please refer to FIGS. 1A, 3A, and 4A to 4G. In a first implementation of a first embodiment of the present disclosure, the manufacturing method of a micro fluid actuator 101 is provided. As shown in the step S11 and FIG. 4A, a substrate 21 is provided, and the substrate 21 is a substrate applied with a 1P6M (P stands for the ploy layer and M stands for the metal layer) process. The substrate 21 is manufactured by sequentially stacking a silicon substrate, a silicon dioxide layer 22, a first polycrystalline silicon layer 23A, and a main structure 24A. Next, a first protection layer 25 is deposited on a first surface (namely, the upper surface) of the substrate 21, thus defining a main region 20A. It is understood that, the material of the first protection layer 25 may be silicon dioxide or silicon nitride, but embodiments are not limited thereto; in some embodiments, the material of the first protection layer 25 may be adjusted according to requirements in the manufacturing process. As shown in the step S12 and FIG. 4B, an actuation region 30 is deposited on the first protection layer 25, and the steps for forming the actuation region 30 include sequentially depositing a lower electrode layer 32, depositing a piezoelectric actuation layer 33, and depositing an upper electrode layer 34. It is understood that, in the first embodiment, the number of the actuation region 30 is one, but embodiments are not limited thereto. In some embodiments, the number and the position of the actuation region 30 may be adjusted according to design requirements. As shown in the step S13 and FIG. 4C, a portion of the first protection layer 25 is etched by lithography dry etching to produce at least one first protection layer flow channel 251. The lithography dry etching may be reactive-ion etching (RIE) or inductively coupled plasma (ICP) etching, but embodiments are not limited thereto. In some embodiments, the implementation of the lithography dry etching may be changed according to design requirements. As shown in the step S14 and FIG. 4D, a portion of a main structure 24A of the substrate 21 is etched by wet etching to produce a chamber body 26 and a first polycrystalline silicon flow channel region 2312A, while a region of a 1P6M oxidation layer middle section 2414 of the main structure 24A is not etched. The main structure 24A is applied with the 1P6M process, so that corresponding patterned structures are respectively formed on at least one 1P6M oxidation layer structure 2411, at least one 1P6M tungsten structure 2412, at least one 1P6M metal structure 2413, a 1P6M oxidation layer middle section 2414, and other structures in advance. It is understood that, in the first embodiment of the present disclosure, the number of the stacked 1P6M tungsten structures 2412 and the number of the stacked 1P6M metal structures 2413 are six, but embodiments are not limited thereto. In some embodiments, the number of the stacked 1P6M tungsten structures 2412 and the number of the stacked 1P6M metal structures 2413 may be adjusted according to design requirements. Furthermore, it is understood that, the etching agent of the wet etching may be sulfonic acid, but embodiments are not limited thereto. In some embodiments, the implementation of the wet etching may be adjusted according to design requirements. As shown in the step S15 and FIG. 4E, a portion of a second surface (namely, the lower surface) of the substrate 21 is etched by reactive-ion etching (RIE) to produce at least one substrate silicon flow channel 211A. As shown in the step S16 and FIG. 4F, a portion of a silicon dioxide layer 22 is etched by dry etching to produce at least one silicon dioxide flow channel 221A. The dry etching may be implemented by HF gas etching, but embodiments are not limited thereto. In some embodiments, the implementation of the dry etching may be changed according to design requirements. As shown in the step S17 and FIG. 4G, a lower valve region 10 is assembled under the second surface of the substrate 21, and an upper valve region 40 is assembled on the first protection layer 25.

Please refer to FIG. 2A. FIG. 2A illustrates a schematic view of a lower valve region 10 and an upper valve region 40 of a first implementation of the present disclosure. The lower valve region 10 has a lower-portion dry film layer 11, a lower-portion valve layer 12, and a lower-portion valve hole layer 13. The lower-portion dry film layer 11, the lower-portion valve layer 12, and the lower-portion valve hole layer 13 are sequentially stacked with one another. The lower-portion dry film layer 11 has at least one lower-portion dry film flow channel region 111A. The lower-portion valve layer 12 has at least one lower valve cover 121. The lower-portion valve hole layer 13 has at least one lower valve channel 131. The upper valve region 40 has an upper-portion dry film layer 41, an upper-portion valve hole layer 42, and an upper-portion valve layer 43. The upper-portion dry film layer 41, the upper-portion valve hole layer 42, and the upper-portion valve layer 43 are sequentially stacked with one another from the actuation region 30. The upper-portion dry film layer 41 has at least one upper-portion dry film flow channel region 411. The upper-portion valve hole layer 42 has at least one upper valve channel 421. The upper-portion valve layer 43 has at least one upper valve cover 431. Please refer to FIG. 2B. FIG. 2B illustrates a schematic view of a lower valve region 10 and an upper valve region 40 of a second implementation of the present disclosure. The difference between the first implementation and the second implementation is that the position of the lower-portion dry film flow channel region 111A in the first implementation and the position of the lower-portion dry film flow channel region 111B in the second implementation are different, and the position of the lower-portion dry film flow channel region 111A/111B may be changed in accordance with the substrate silicon flow channel. It is understood that, in any embodiment or any implementation of the present disclosure, the placement of the lower valve region 10 and the placement of the upper valve region 40 may be increased or decreased according to design requirements, but embodiments are not limited thereto. In some embodiments or implementations, the placement of the lower valve region 10 or the placement of the upper valve region 40 may be increased or decreased according to design requirements.

Figure 4A:
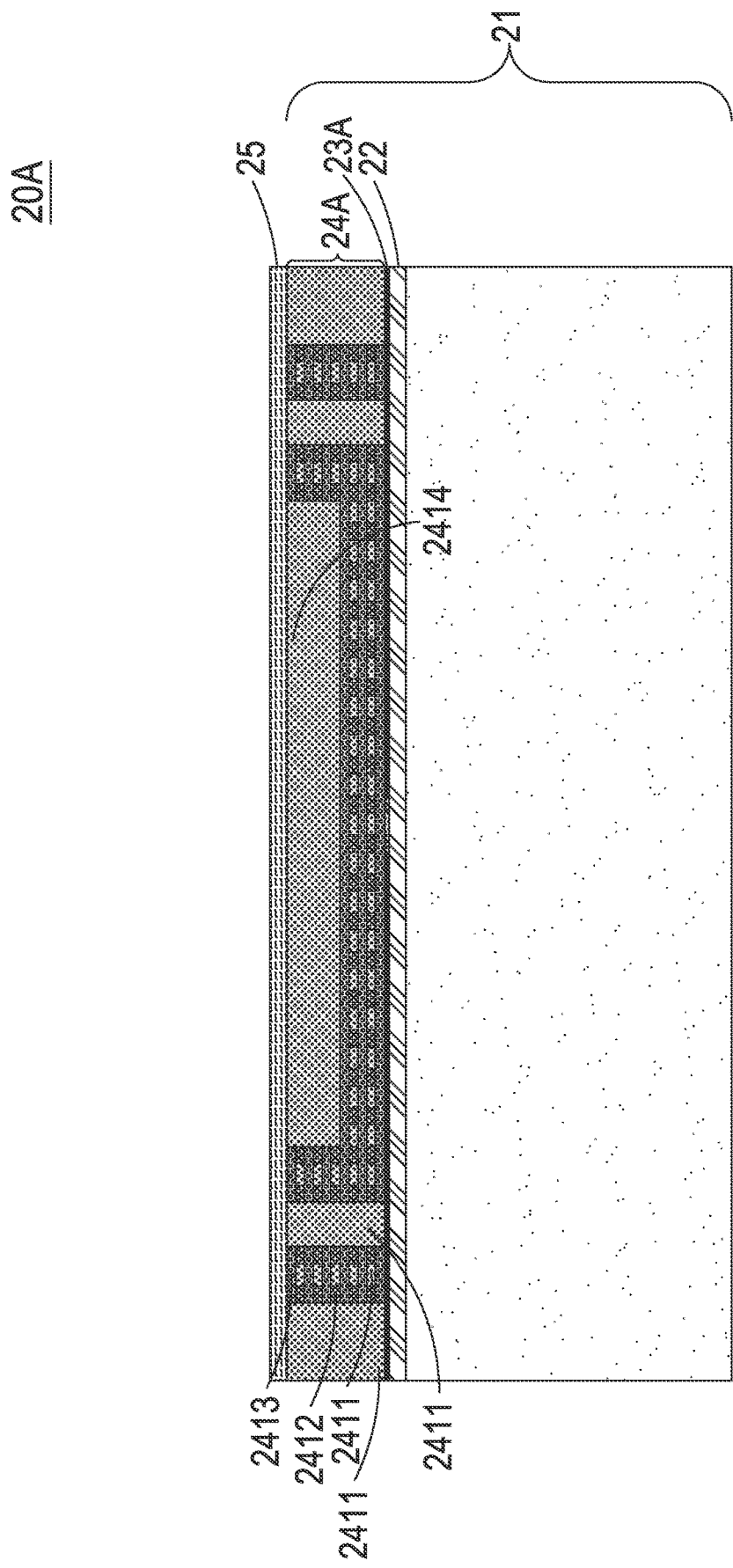
FIGS. 4A to 4G illustrate schematic views showing a manufacturing method of a micro fluid actuator according to a first embodiment of the present disclosure.
Figure 4B:
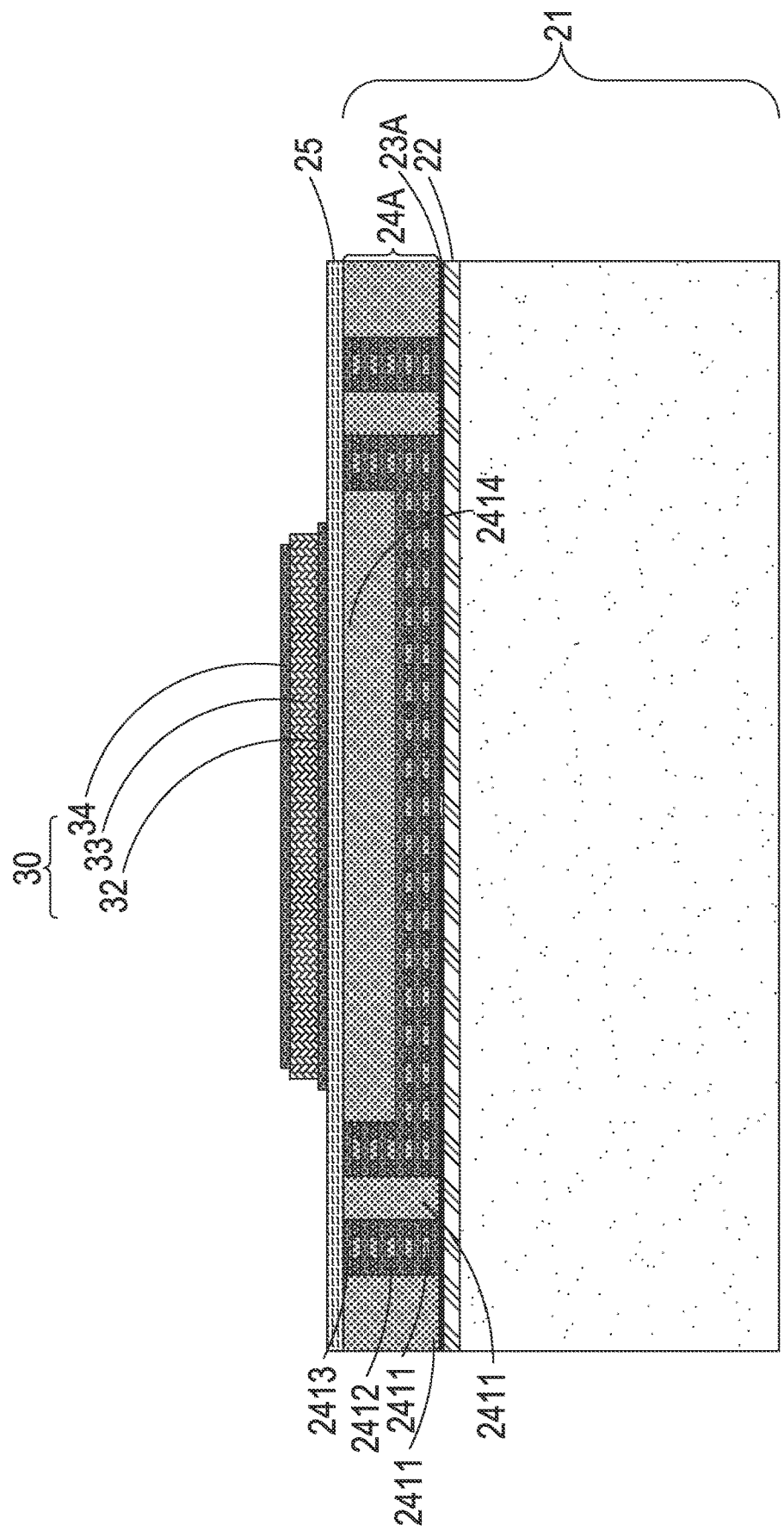
Figure 4C:
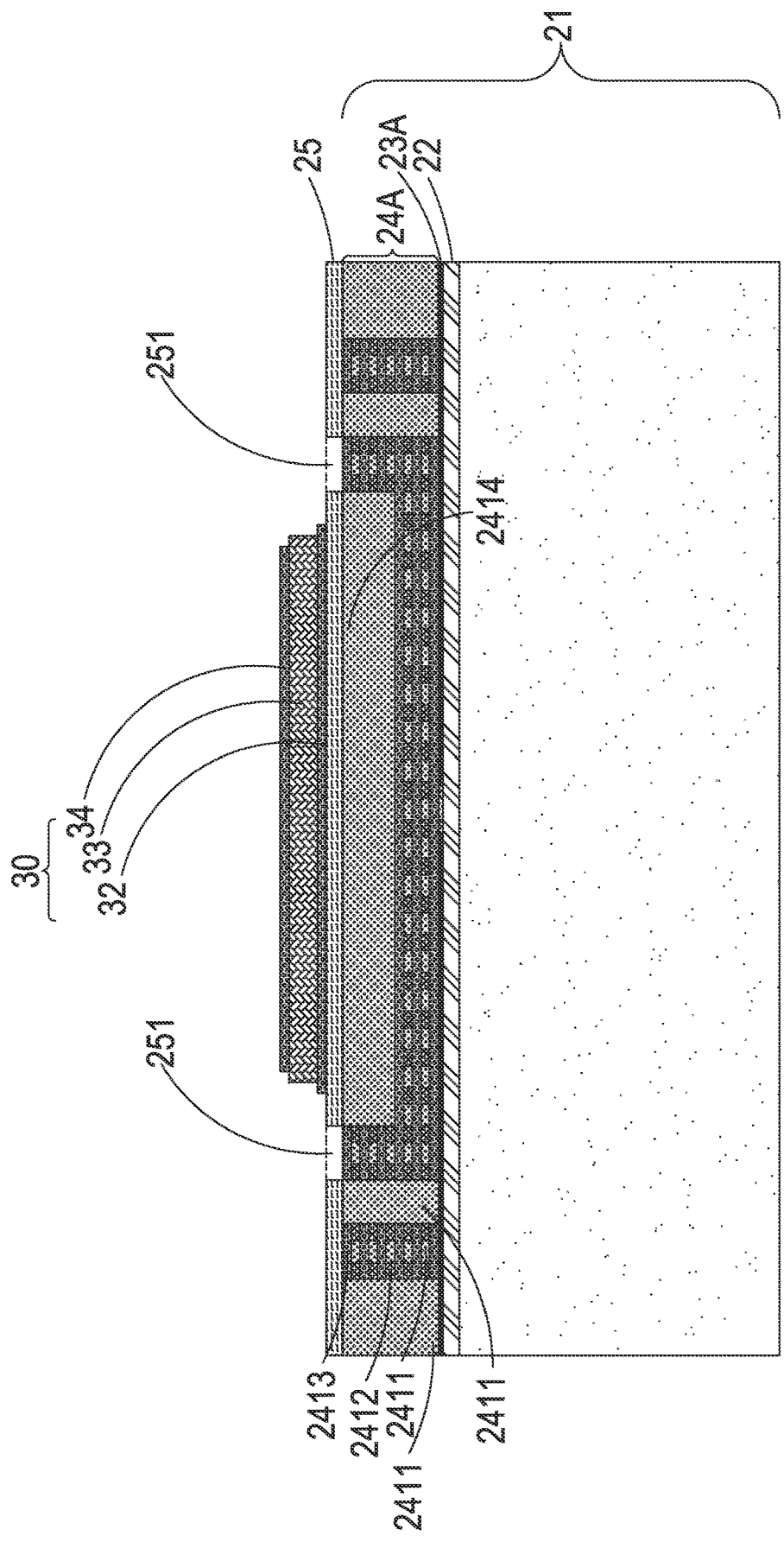
Figure 4D:
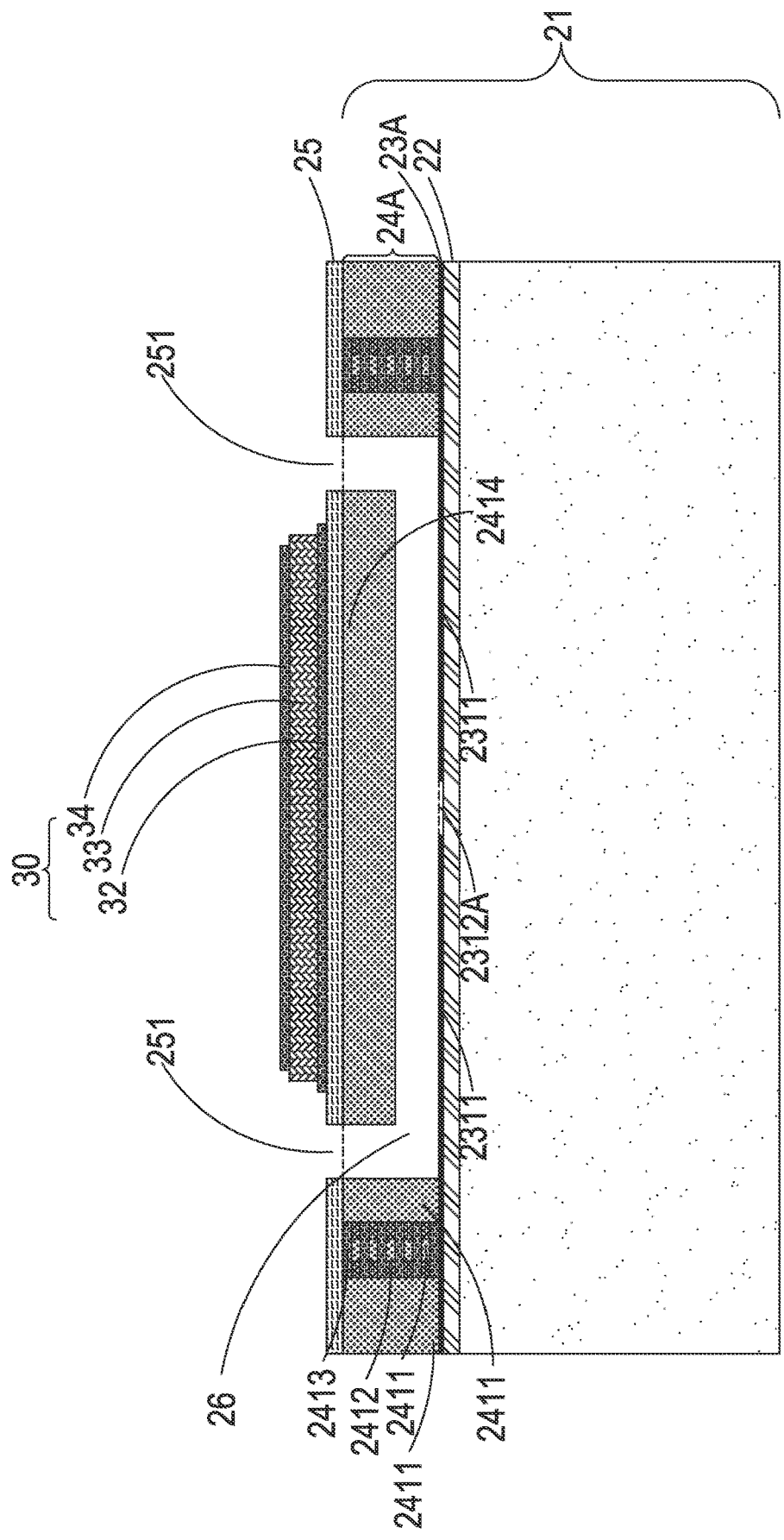
Figure 4E:
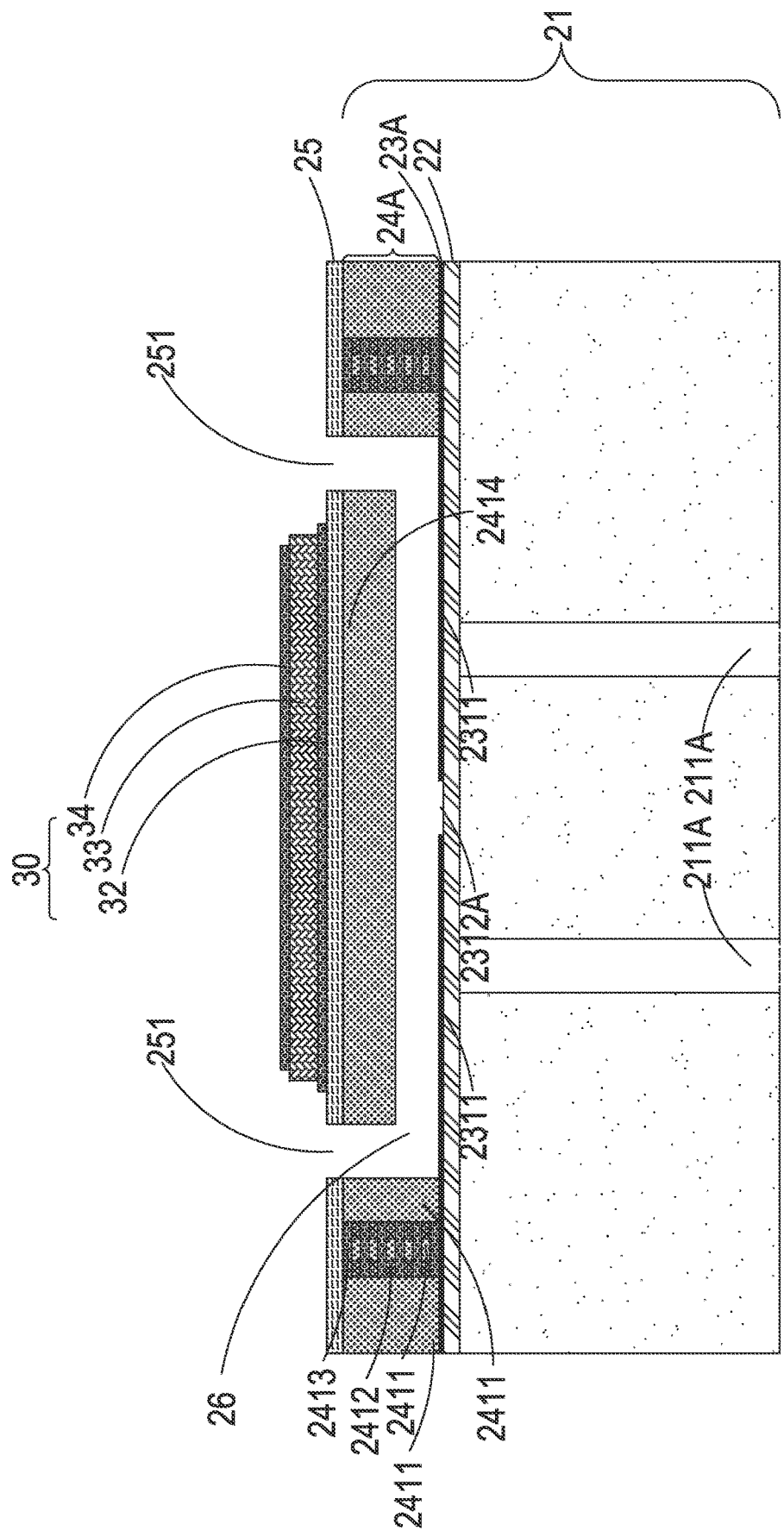
Figure 4F:
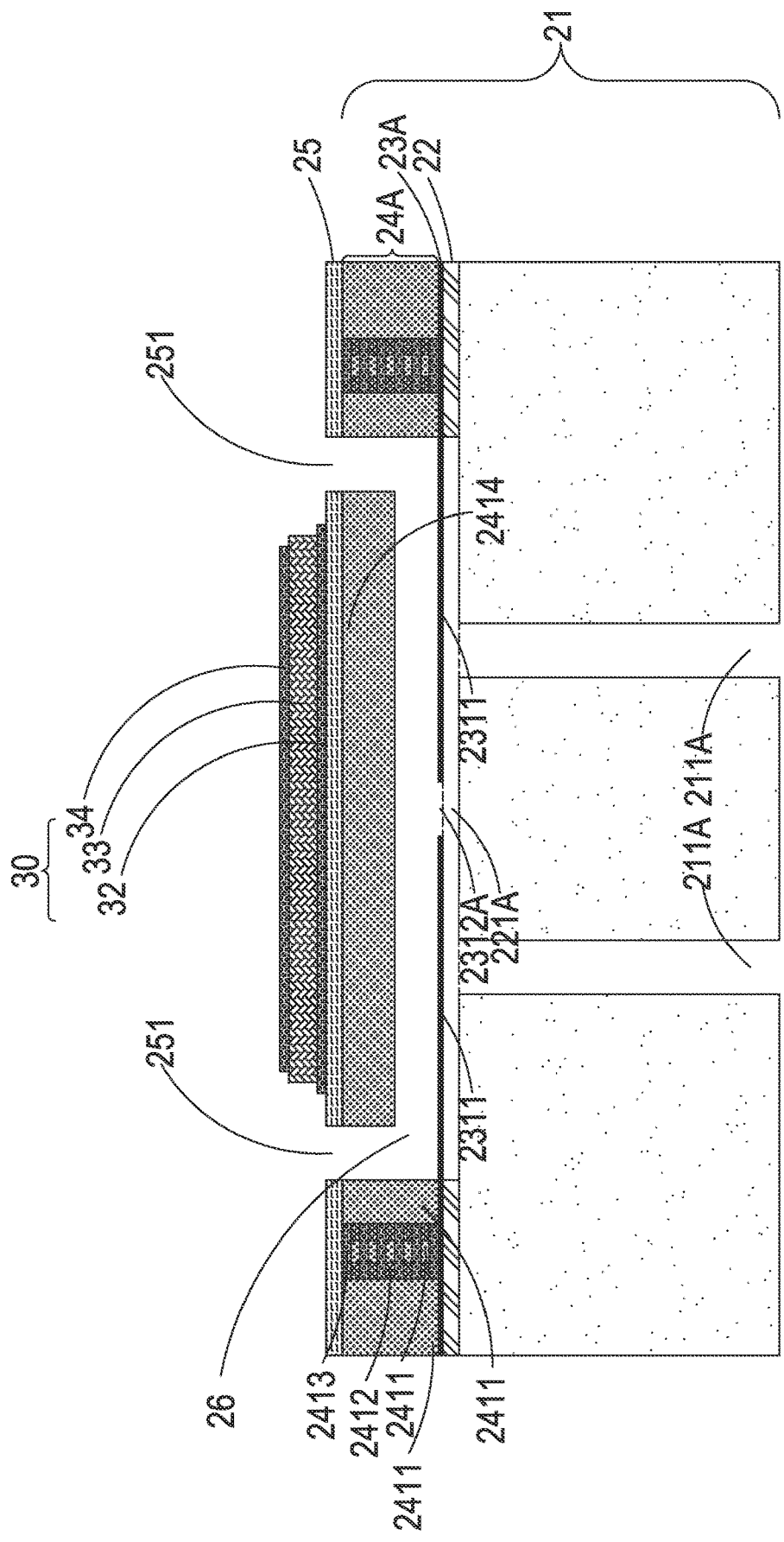
Figure 4G:
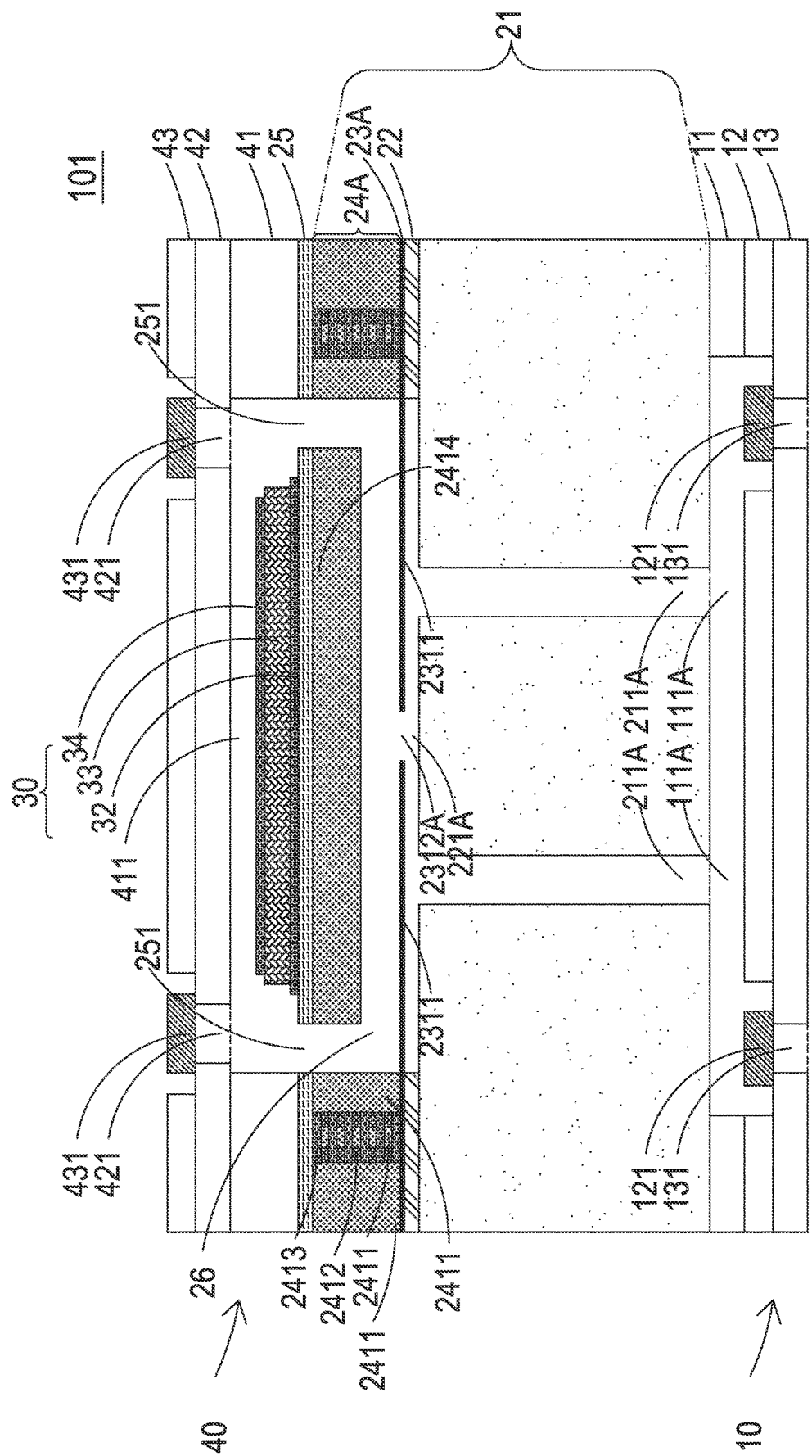
Figure 4H:
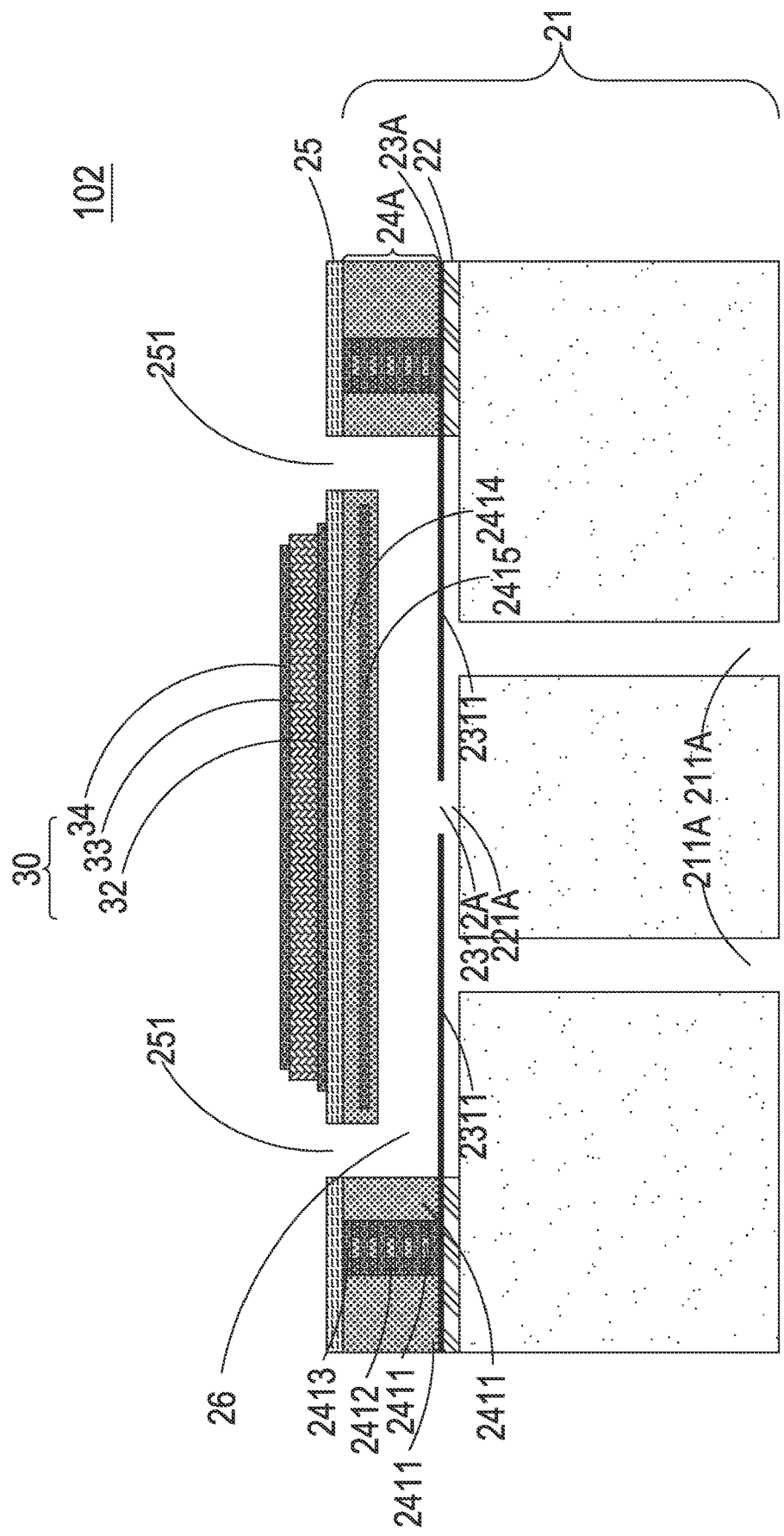
FIG. 4H illustrates a schematic view of the micro fluid actuator of a different implementation of the first embodiment.

Please refer to FIG. 4H. FIG. 4H illustrates the micro fluid actuator 102 of a second implementation of the first embodiment. In the second implementation, the region of the 1P6M oxidation layer middle section 2414 of the main structure 24A further includes a 1P6M metal layer middle section 2415. The main structure 24A is applied with the 1P6M process, so that corresponding patterned structures are respectively formed on at least one 1P6M oxidation layer structure 2411, at least one 1P6M tungsten structure 2412, at least one 1P6M metal structure 2413, a 1P6M oxidation layer middle section 2414, a 1P6M metal layer middle section 2415, and other structures in advance. It is understood that, in the first embodiment of the present disclosure, the placement of the 1P6M metal layer middle section 2415 may be increased or decreased according to design requirements, but embodiments are not limited thereto. In some embodiments or implementations, the placement of the 1P6M metal layer middle section 2415 may be increased or decreased according to design requirements as well.

A manufacturing method of micro fluid actuator includes following steps: providing a substrate 21, and the substrate 21 is a substrate applied with a 1P6M (one ploy layer and six metal layers) process; depositing a first protection layer 25 on a first surface of the substrate 21; depositing an actuation region 30 on the first protection layer 25, and the steps for forming the actuation region 30 include sequentially depositing a lower electrode layer 32, depositing a piezoelectric actuation layer 33, and depositing an upper electrode layer 34; and applying lithography dry etching to a portion of the first protection layer 25 to produce at least one first protection layer flow channel 251. In some embodiments, the manufacturing method further includes following steps: applying wet etching to a portion of a main structure 24B of the substrate 21 to produce a chamber body 26, while a region of a 1P6M oxidation layer middle section 2414 of the main structure 24B is not etched; and applying reactive-ion etching (RIE) to a portion of a second surface of the substrate 21 to produce at least one substrate silicon flow channel 211B, at least one silicon dioxide flow channel 221B, and at least one first polycrystalline silicon flow channel region 2312B. In some embodiments, the manufacturing method further includes following steps: assembling a lower valve region 10 under the second surface of the substrate 21 and assembling an upper valve region 40 on the first protection layer 25.

Please refer to FIGS. 1B, 3B, and 5A to 5F. In a first implementation of a second embodiment of the present disclosure, the manufacturing method of a micro fluid actuator 201 is provided. As shown in the step S21 and FIG. 5A, a substrate 21 is provided, and the substrate 21 is a substrate applied with a 1P6M (P stands for the ploy layer and M stands for the metal layer) process. The substrate 21 is manufactured by sequentially stacking a silicon substrate, a silicon dioxide layer 22, a first polycrystalline silicon layer 23B, and a main structure 24B. Next, a first protection layer 25 is deposited on a first surface (namely, the upper surface) of the substrate 21, thus defining a main region 20B. The first polycrystalline silicon layer 23B is formed by at least one first polycrystalline silicon 2321 and at least one oxidation region 2322. It is understood that, the material of the first protection layer 25 may be silicon dioxide or silicon nitride, but embodiments are not limited thereto; in some embodiments, the material of the first protection layer 25 may be adjusted according to requirements in the manufacturing process. As shown in the step S22 and FIG. 5B, an actuation region 30 is deposited on the first protection layer 25, and the steps for forming the actuation region 30 include sequentially depositing a lower electrode layer 32, depositing a piezoelectric actuation layer 33, and depositing an upper electrode layer 34. It is understood that, in the second embodiment, the number of the actuation region 30 is one, but embodiments are not limited thereto. In some embodiments, the number and the position of the actuation region 30 may be adjusted according to design requirements. As shown in the step S23 and FIG. 5C, a portion of the first protection layer 25 is etched by lithography dry etching to produce at least one first protection layer flow channel 251. The lithography dry etching may be reactive-ion etching (RIE) or inductively coupled plasma (ICP) etching, but embodiments are not limited thereto. In some embodiments, the implementation of the lithography dry etching may be changed according to design requirements. As shown in the step S24 and FIG. 5D, a portion of a main structure 24B of the substrate 21 is etched by wet etching to produce a chamber body 26, while a region of a 1P6M oxidation layer middle section 2414 of the main structure 24B is not etched.

The main structure 24B is applied with the 1P6M process, so that corresponding patterned structures are respectively formed on at least one 1P6M oxidation layer structure 2411, at least one 1P6M tungsten structure 2412, at least one 1P6M metal structure 2413, a 1P6M oxidation layer middle section 2414, at least one pair of OMO (oxide-metal-oxide) structure 2416, and an OMO flow channel region 2417, and other structures in advance. It is understood that, in the second embodiment of the present disclosure, the number of the stacked 1P6M tungsten structures 2412 and the number of the stacked 1P6M metal structures 2413 are six, but embodiments are not limited thereto. In some embodiments, the number of the stacked 1P6M tungsten structures 2412 and the number of the stacked 1P6M metal structures 2413 may be adjusted according to design requirements. Furthermore, it is understood that, the etching agent of the wet etching may be sulfonic acid, but embodiments are not limited thereto. In some embodiments, the implementation of the wet etching may be adjusted according to design requirements. As shown in the step S25 and FIG. 5E, a portion of a second surface (namely, the lower surface) of the substrate 21 is etched by reactive-ion etching (RIE) to produce at least one substrate silicon flow channel 211B, at least one silicon dioxide flow channel 221B, and at least one first polycrystalline silicon flow channel region 2312B. As shown in the step S26 and FIG. 5F, a lower valve region 10 is assembled under the second surface of the substrate 21, and an upper valve region 40 is assembled on the first protection layer 25.

Figure 5A:
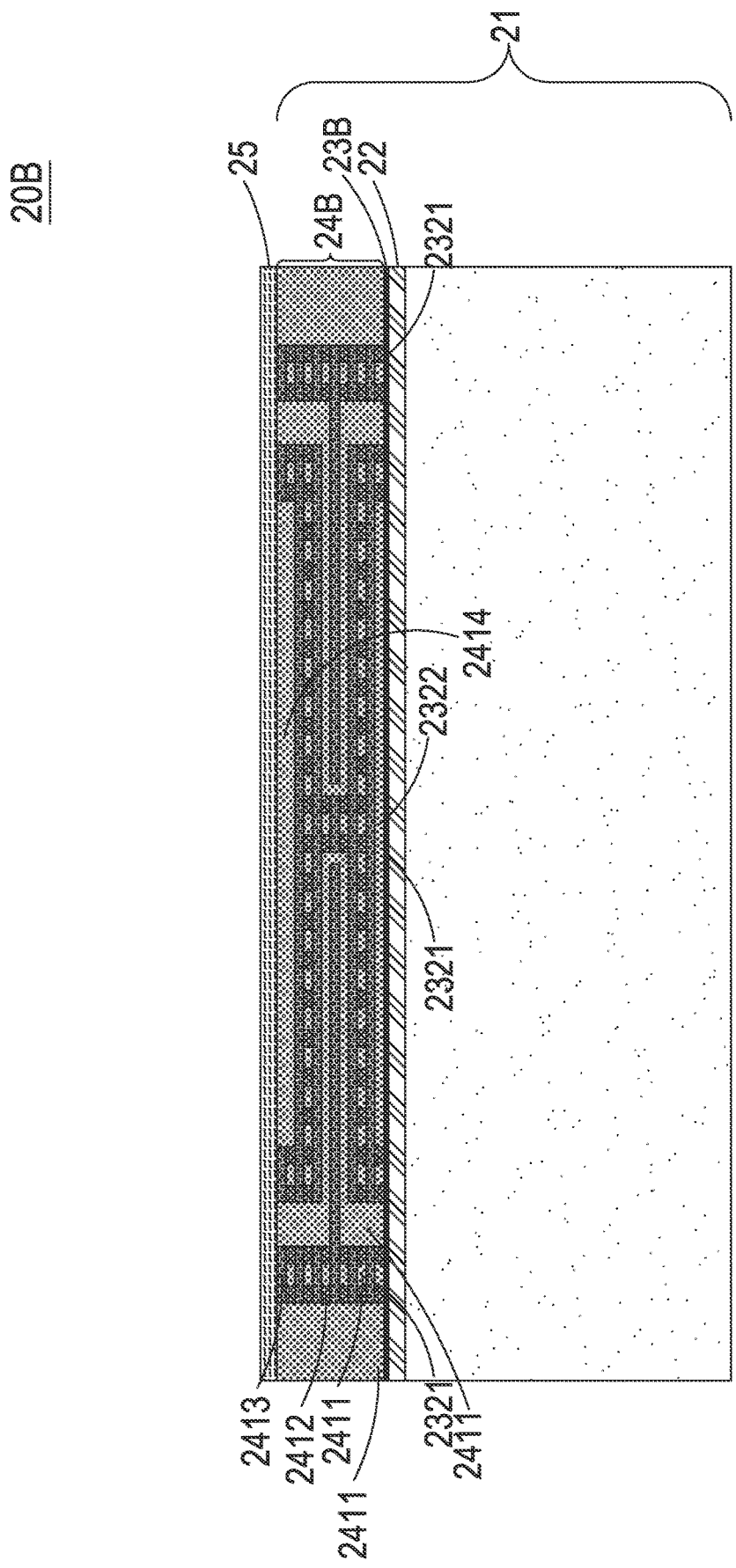
FIG. 5A to 5F illustrates schematic views showing a manufacturing method of a micro fluid actuator according to a second embodiment of the present disclosure.
Figure 5B:
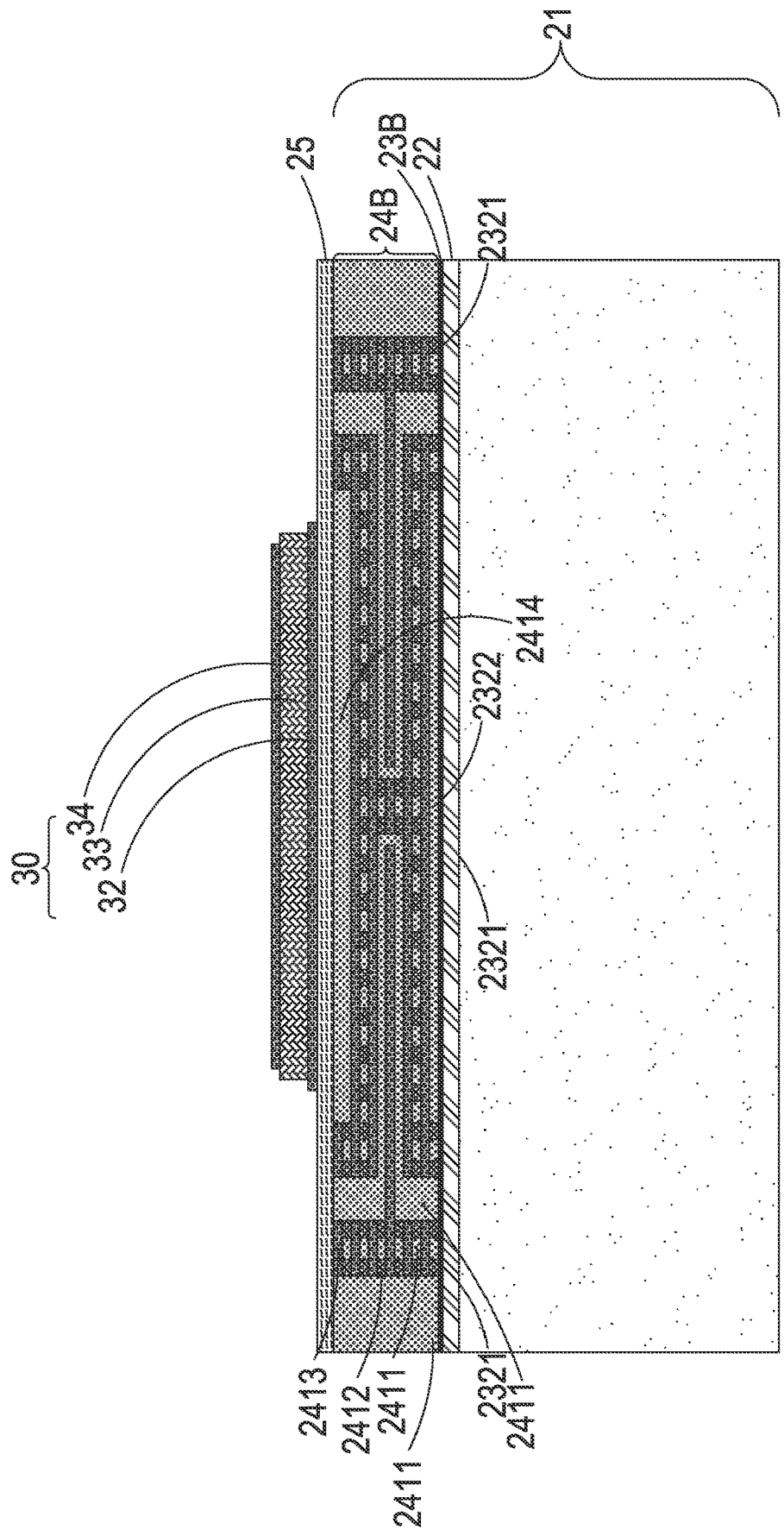
Figure 5C:
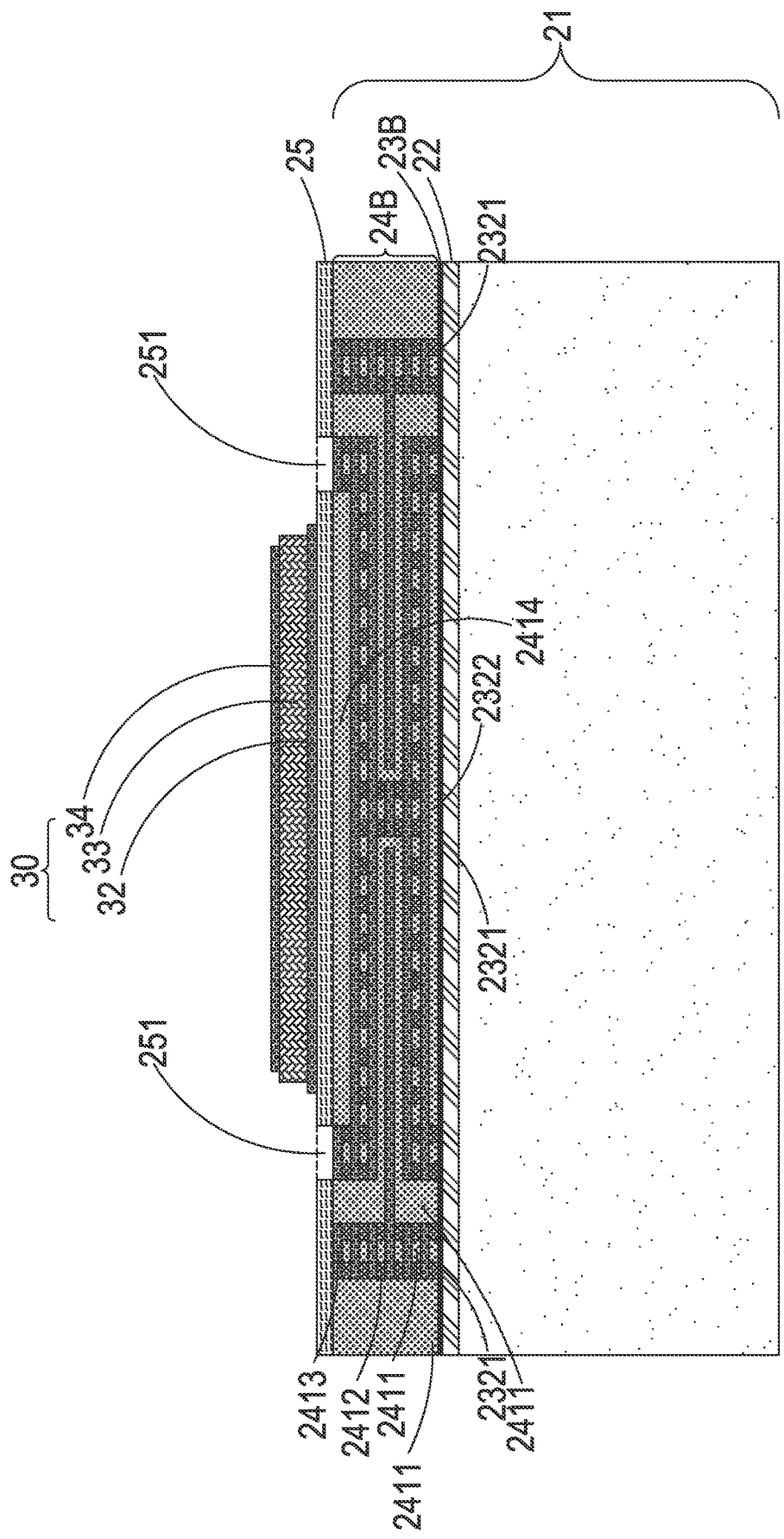
Figure 5D:
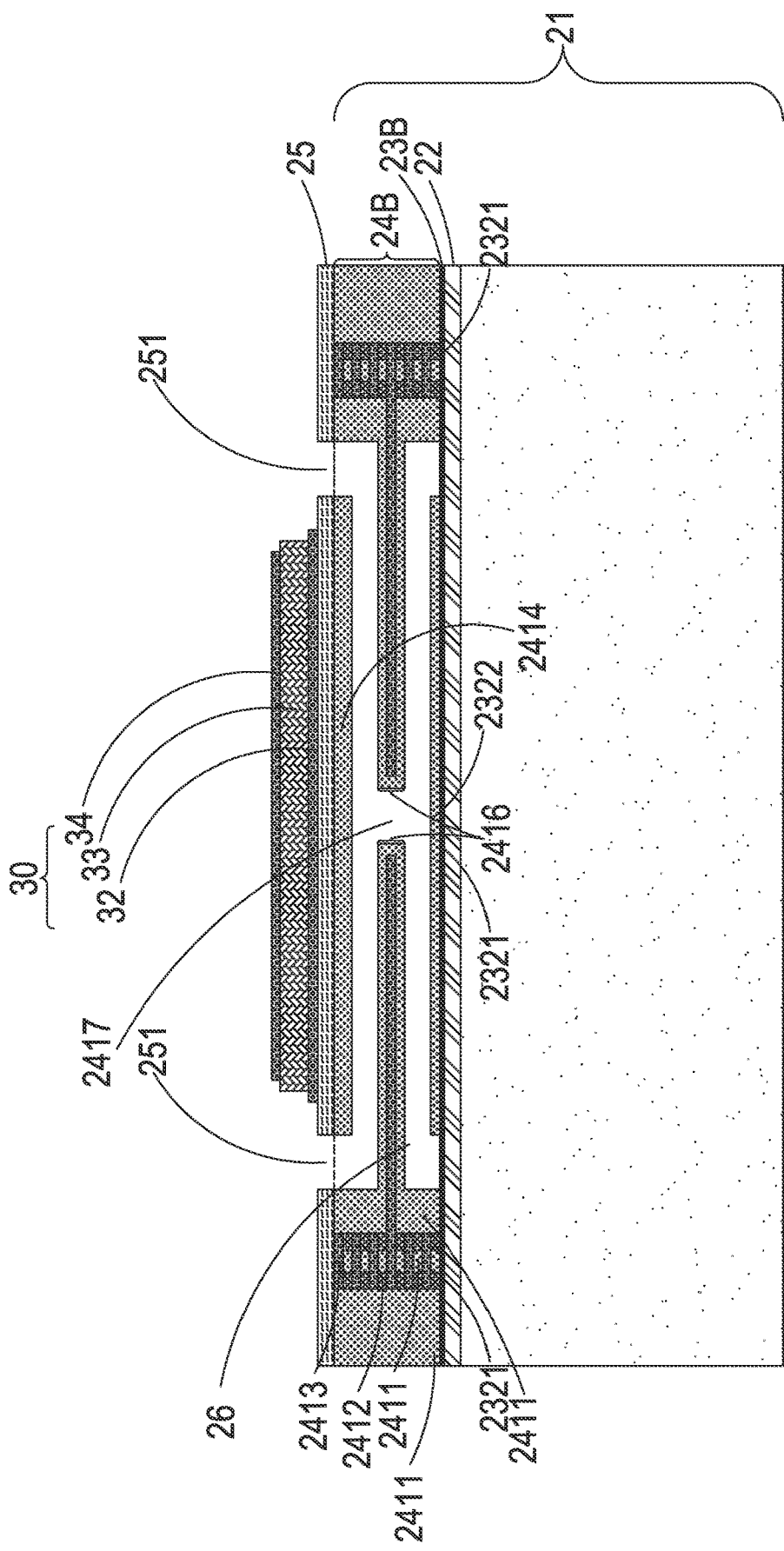
Figure 5E:
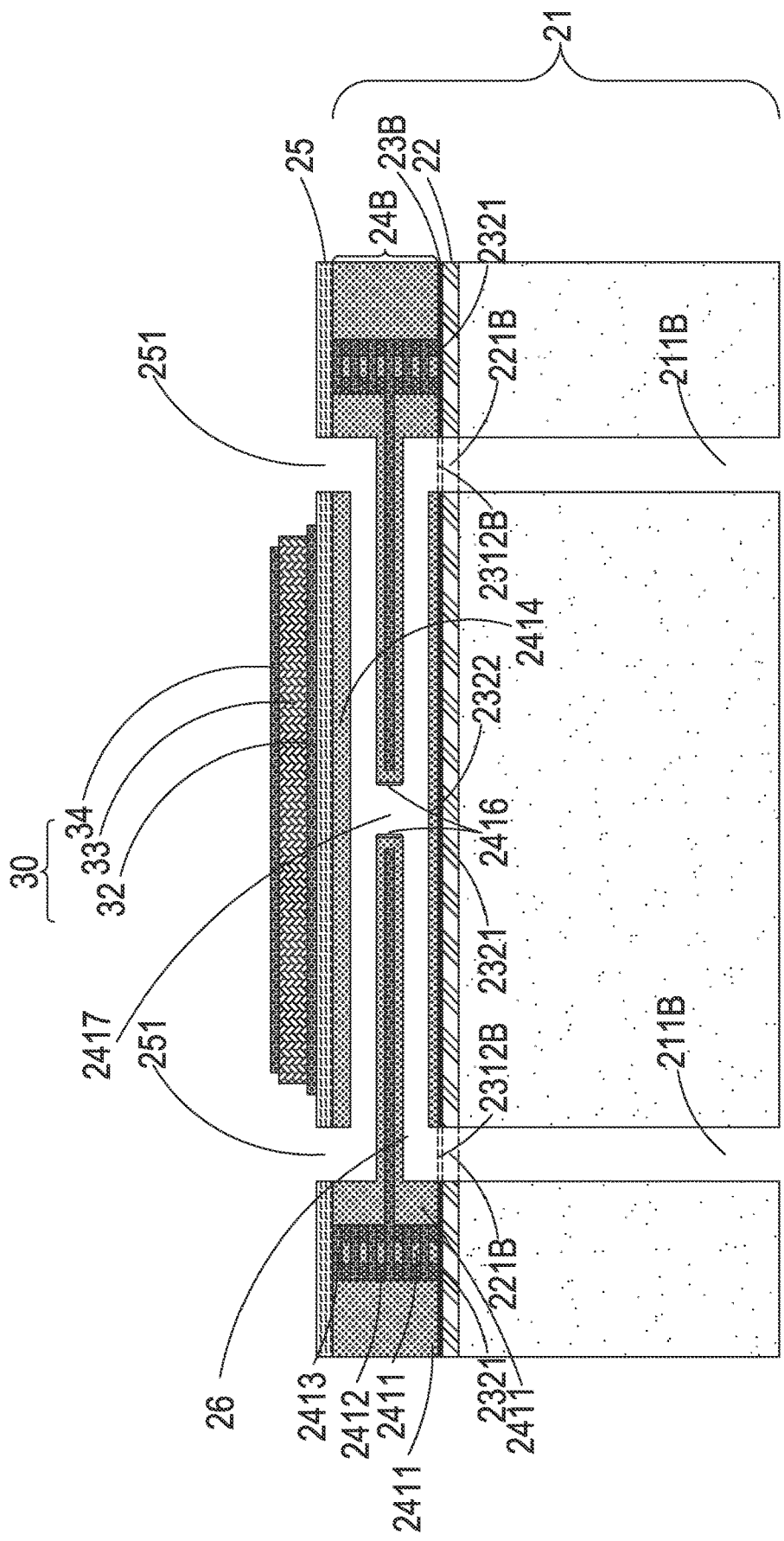
Figure 5F:
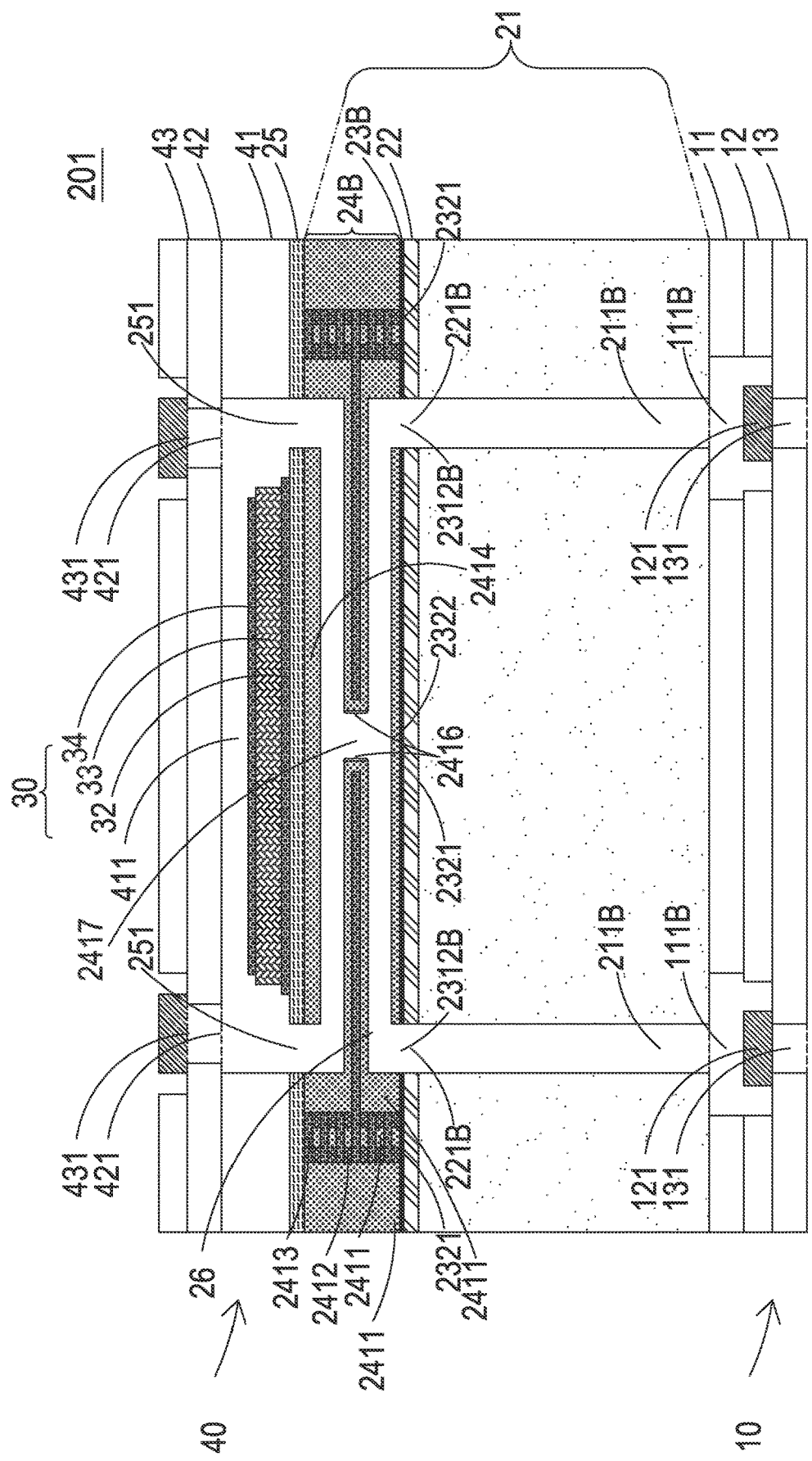
Figure 5G:
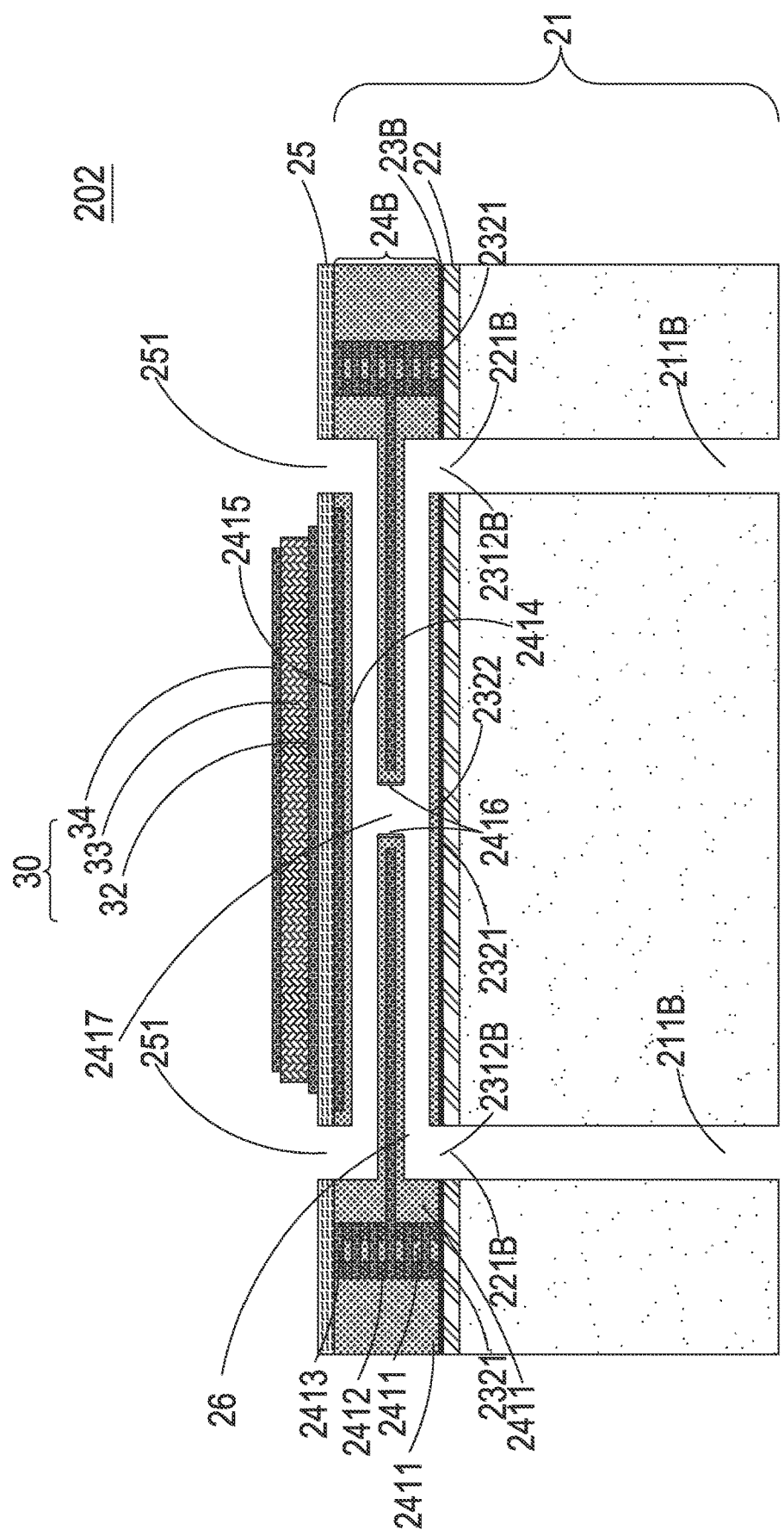
FIGS. 5G and 5H illustrate schematic views of the micro fluid actuator of different implementations of the second embodiment.

Please refer to FIG. 5G. FIG. 5G illustrates the micro fluid actuator 202 of a second implementation of the second embodiment. In the second implementation, the region of the 1P6M oxidation layer middle section 2414 of the main structure 24B further includes a 1P6M metal layer middle section 2415. The main structure 24B is applied with the 1P6M process, so that corresponding patterned structures are respectively formed on at least one 1P6M oxidation layer structure 2411, at least one 1P6M tungsten structure 2412, at least one 1P6M metal structure 2413, a 1P6M oxidation layer middle section 2414, a 1P6M metal layer middle section 2415, at least one pair of OMO (oxide-metal-oxide) structure 2416, an OMO flow channel region 2417, and other structures in advance. It is understood that, in the second embodiment of the present disclosure, the placement of the 1P6M metal layer middle section 2415 may be increased or decreased according to design requirements, but embodiments are not limited thereto. In some embodiments or implementations, the placement of the 1P6M metal layer middle section 2415 may be increased or decreased according to design requirements as well.

Figure 5H:
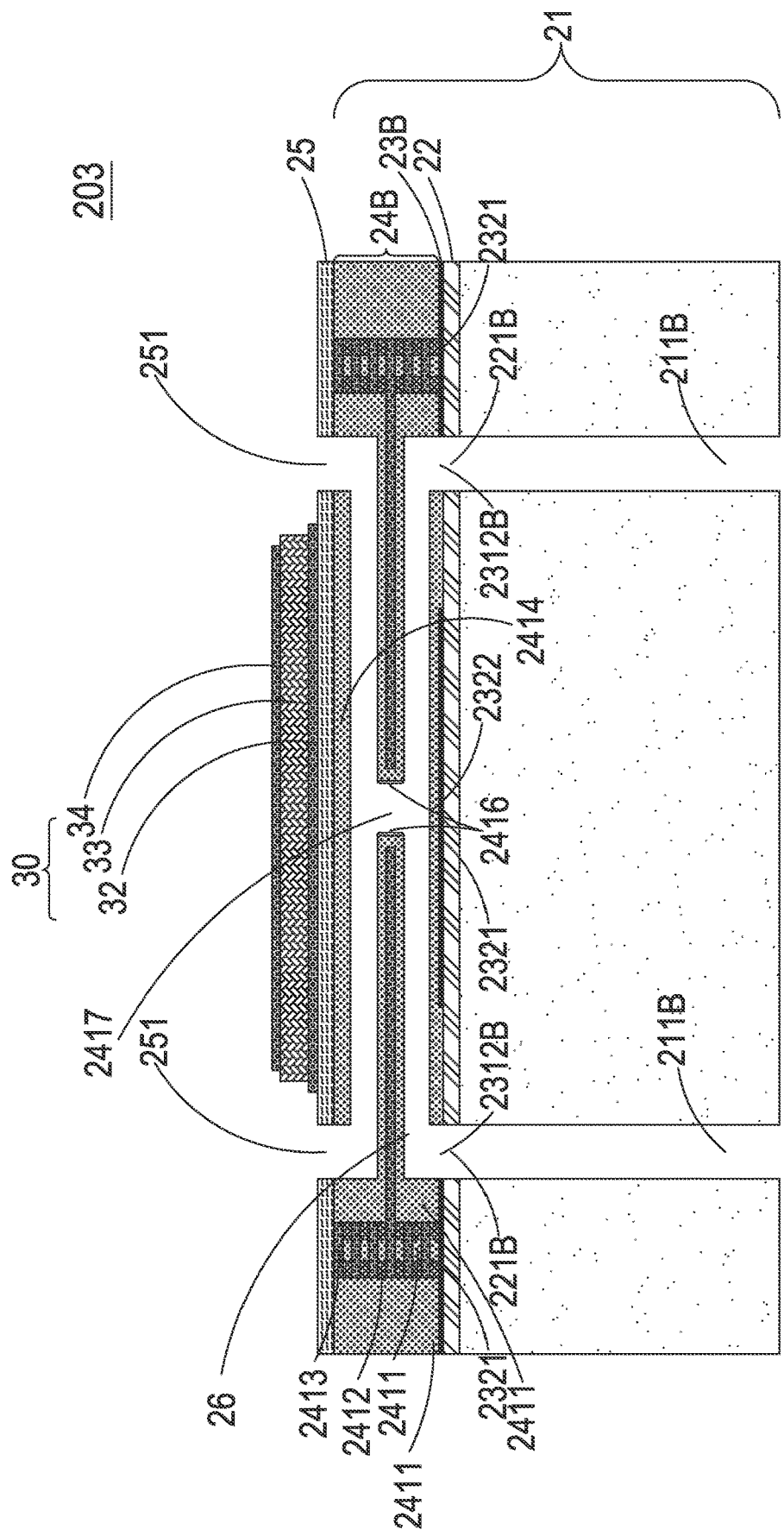

Please refer to FIG. 5H. FIG. 5H illustrates the micro fluid actuator 203 of a third implementation of the second embodiment. In the third implementation, in the step of applying wet etching to a portion of the main structure 24B of the substrate 21, an oxidation region 2322 of the main structure 24B is not etched as well. In other words, the first polycrystalline silicon 2321 between the substrate silicon flow channels 211B is covered by the oxidation region 2322. The main structure 24B is applied with the 1P6M process, so that corresponding patterned structures are respectively formed on at least one 1P6M oxidation layer structure 2411, at least one 1P6M tungsten structure 2412, at least one 1P6M metal structure 2413, a 1P6M oxidation layer middle section 2414, a 1P6M metal layer middle section 2415, at least one pair of OMO (oxide-metal-oxide) structure 2416, an OMO flow channel region 2417, and other structures in advance.

A manufacturing method of micro fluid actuator includes following steps: providing a substrate 21, and the substrate 21 is a substrate applied with a 2P4M (two ploy layers and four metal layers) process; depositing a first protection layer 25 on a first surface of the substrate 21; depositing an actuation region 30 on the first protection layer 25, and the steps for forming the actuation region 30 include sequentially depositing a lower electrode layer 32, depositing a piezoelectric actuation layer 33, and depositing an upper electrode layer 34; and applying lithography dry etching to a portion of the first protection layer 25 to produce at least one first protection layer flow channel 251. In some embodiments, the manufacturing method further includes following steps: applying wet etching to a portion of a main structure 24C of the substrate 21 to produce a chamber body 26, while a region of a 2P4M oxidation layer middle section 2424 of the main structure 24C is not etched; applying reactive-ion etching (RIE) to a portion of a second surface of the substrate 21 to produce at least one substrate silicon flow channel 211A; and applying dry etching to a portion of a silicon dioxide layer 22 to produce at least one silicon dioxide flow channel 221A. In some embodiments, the manufacturing method further includes following steps: assembling a lower valve region 10 under the second surface of the substrate 21 and assembling an upper valve region 40 on the first protection layer 25.

Please refer to FIGS. 1C, 3C, and 6A to 6G. In a first implementation of a third embodiment of the present disclosure, the manufacturing method of a micro fluid actuator 301 is provided. As shown in the step S31 and FIG. 6A, a substrate 21 is provided, and the substrate 21 is a substrate applied with a 2P4M (P stands for the ploy layer and M stands for the metal layer) process. The substrate 21 is manufactured by sequentially stacking a silicon substrate, a silicon dioxide layer 22, a POP (poly-oxide-poly) structure 23C, and a main structure 24C. Next, a first protection layer 25 is deposited on a first surface (namely, the upper surface) of the substrate 21, thus defining a main region 20C. The POP structure 23C is formed by at least one first polycrystalline silicon 2321, at least one oxidation region 2322, at least one second polycrystalline silicon 2323, and a POP flow channel region 2324. It is understood that, the material of the first protection layer 25 may be silicon dioxide or silicon nitride, but embodiments are not limited thereto; in some embodiments, the material of the first protection layer 25 may be adjusted according to requirements in the manufacturing process. As shown in the step S32 and FIG. 6B, an actuation region 30 is deposited on the first protection layer 25, and the steps for forming the actuation region 30 include sequentially depositing a lower electrode layer 32, depositing a piezoelectric actuation layer 33, and depositing an upper electrode layer 34. It is understood that, in the third embodiment, the number of the actuation region 30 is one, but embodiments are not limited thereto. In some embodiments, the number and the position of the actuation region 30 may be adjusted according to design requirements. As shown in the step S33 and FIG. 6C, a portion of the first protection layer 25 is etched by lithography dry etching to produce at least one first protection layer flow channel 251. The lithography dry etching may be reactive-ion etching (RIE) or inductively coupled plasma (ICP) etching, but embodiments are not limited thereto. In some embodiments, the implementation of the lithography dry etching may be changed according to design requirements. As shown in the step S34 and FIG. 6D, a portion of a main structure 24C of the substrate 21 is etched by wet etching to produce a chamber body 26 and a POP flow channel region 2324, while a region of a 2P4M oxidation layer middle section 2424 of the main structure 24C is not etched. The main structure 24C is applied with the 2P4M process, so that corresponding patterned structures are respectively formed on at least one 2P4M oxidation layer structure 2421, at least one 2P4M tungsten structure 2422, at least one 2P4M metal structure 2423, a 2P4M oxidation layer middle section 2424, and other structures in advance. It is understood that, in the third embodiment of the present disclosure, the number of the stacked 2P4M tungsten structures 2422 and the number of the stacked 2P4M metal structures 2423 are four, but embodiments are not limited thereto. In some embodiments, the number of the stacked 2P4M tungsten structures 2422 and the number of the stacked 2P4M metal structures 2423 may be adjusted according to design requirements. Furthermore, it is understood that, the etching agent of the wet etching may be sulfonic acid, but embodiments are not limited thereto. In some embodiments, the implementation of the wet etching may be adjusted according to design requirements. As shown in the step S35 and FIG. 6E, a portion of a second surface (namely, the lower surface) of the substrate 21 is etched by reactive-ion etching (RIE) to produce at least one substrate silicon flow channel 211A. As shown in the step S36 and FIG. 6F, a portion of a silicon dioxide layer 22 is etched by dry etching to produce at least one silicon dioxide flow channel 221A. The dry etching may be implemented by HF gas etching, but embodiments are not limited thereto. In some embodiments, the implementation of the dry etching may be changed according to design requirements. As shown in the step S37 and FIG. 6G, a lower valve region 10 is assembled under the second surface of the substrate 21, and an upper valve region 40 is assembled on the first protection layer 25.

Figure 6A:
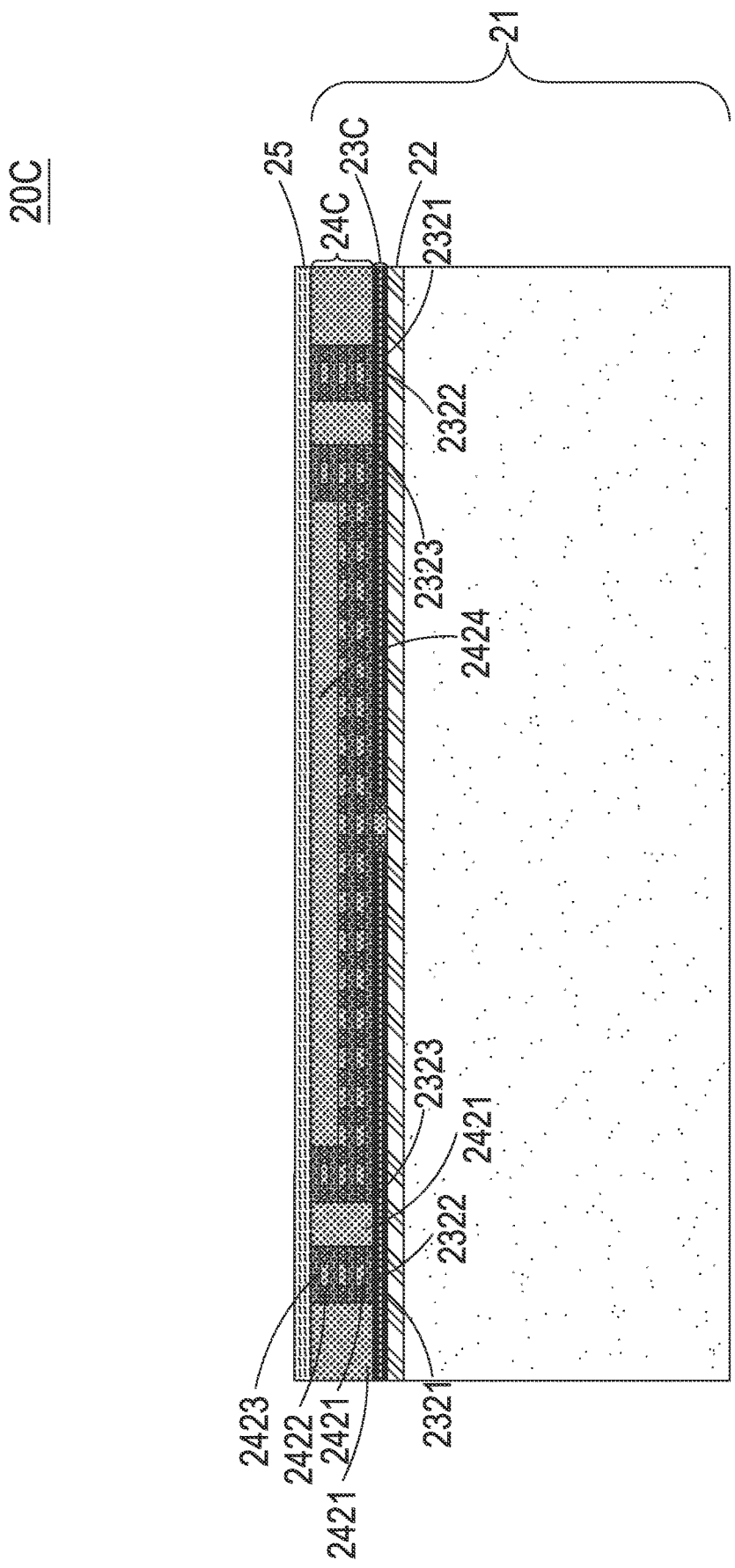
FIGS. 6A to 6G illustrate schematic views showing a manufacturing method of a micro fluid actuator according to a third embodiment of the present disclosure.
Figure 6B:
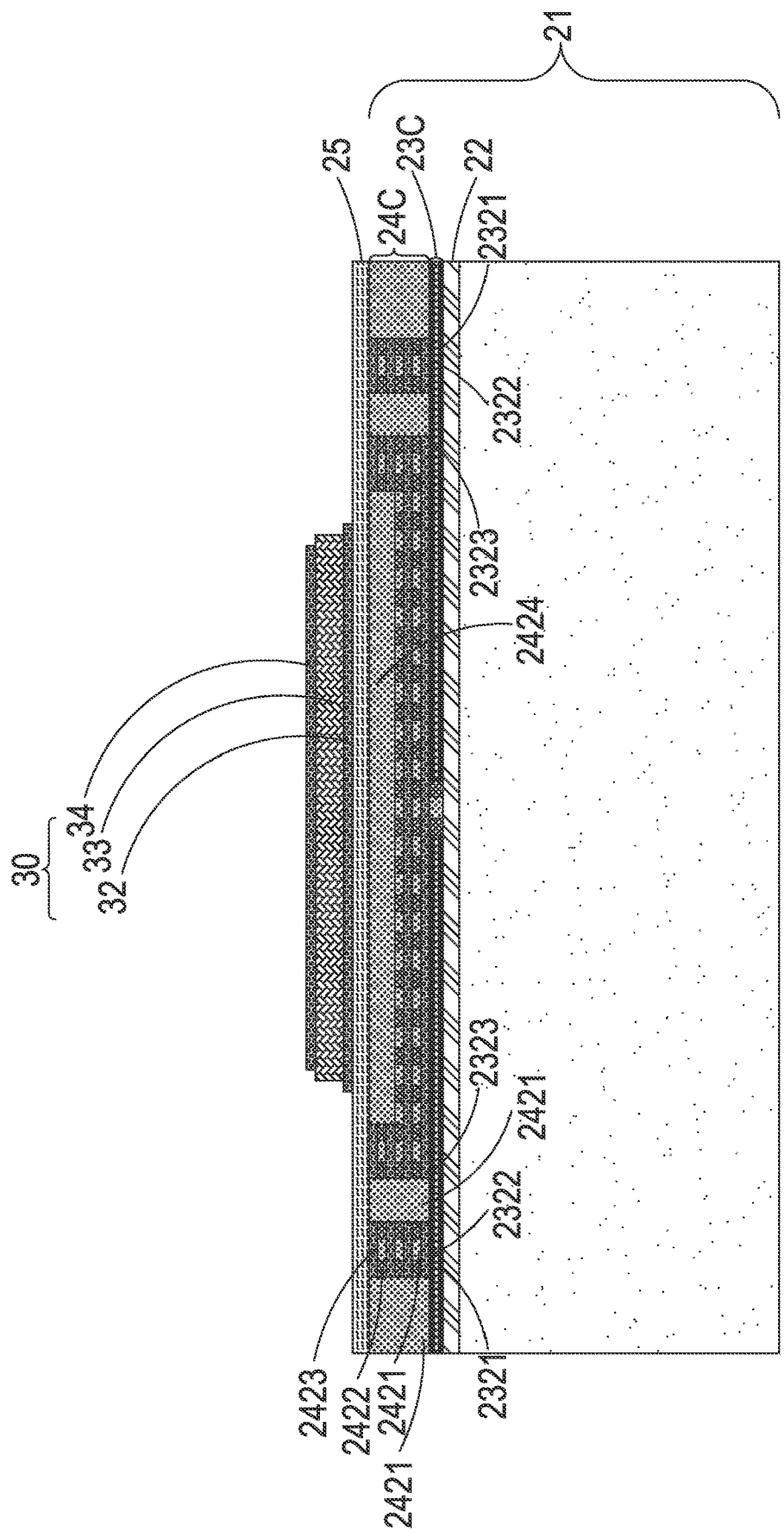
Figure 6C:
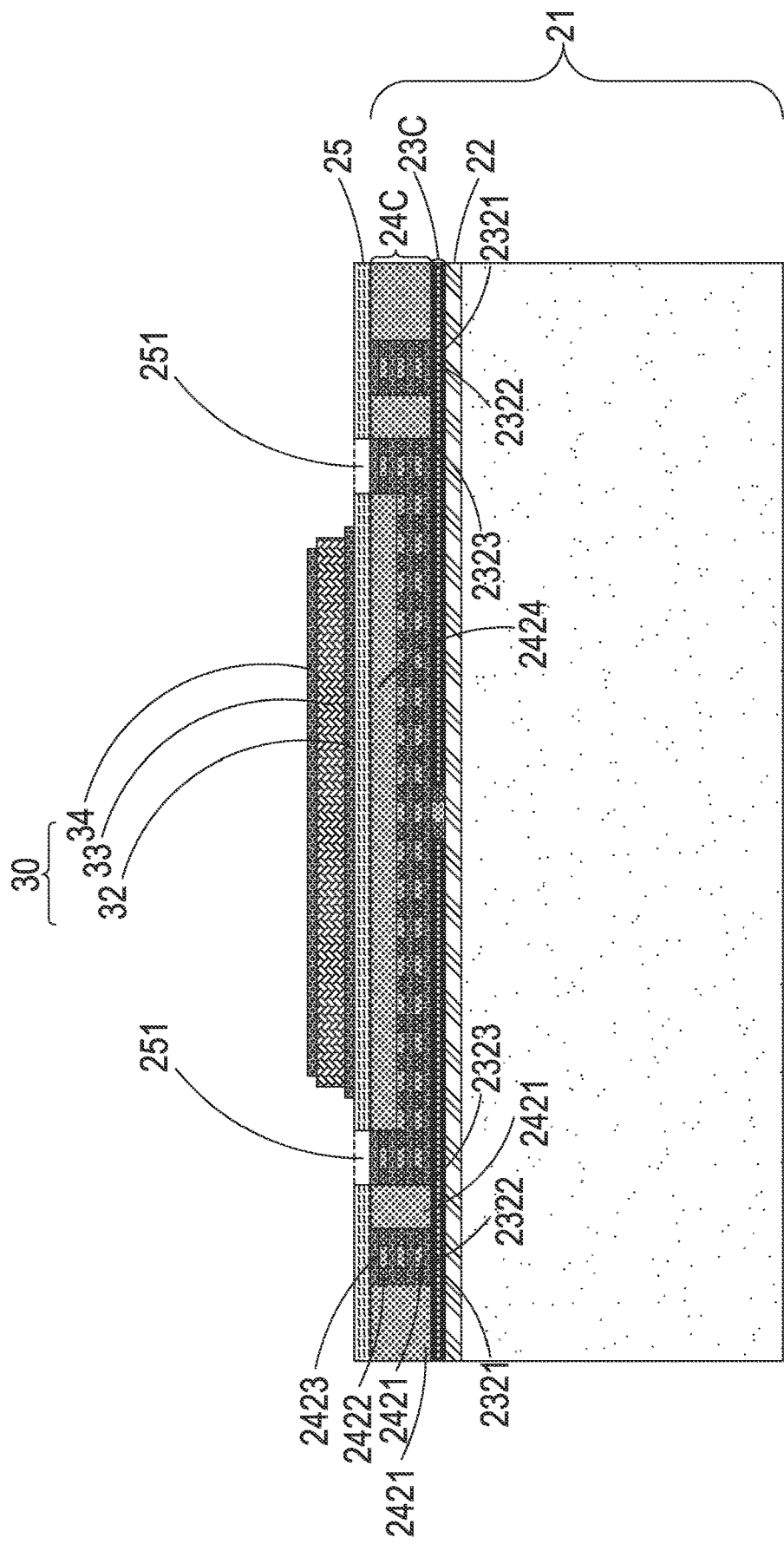
Figure 6D:
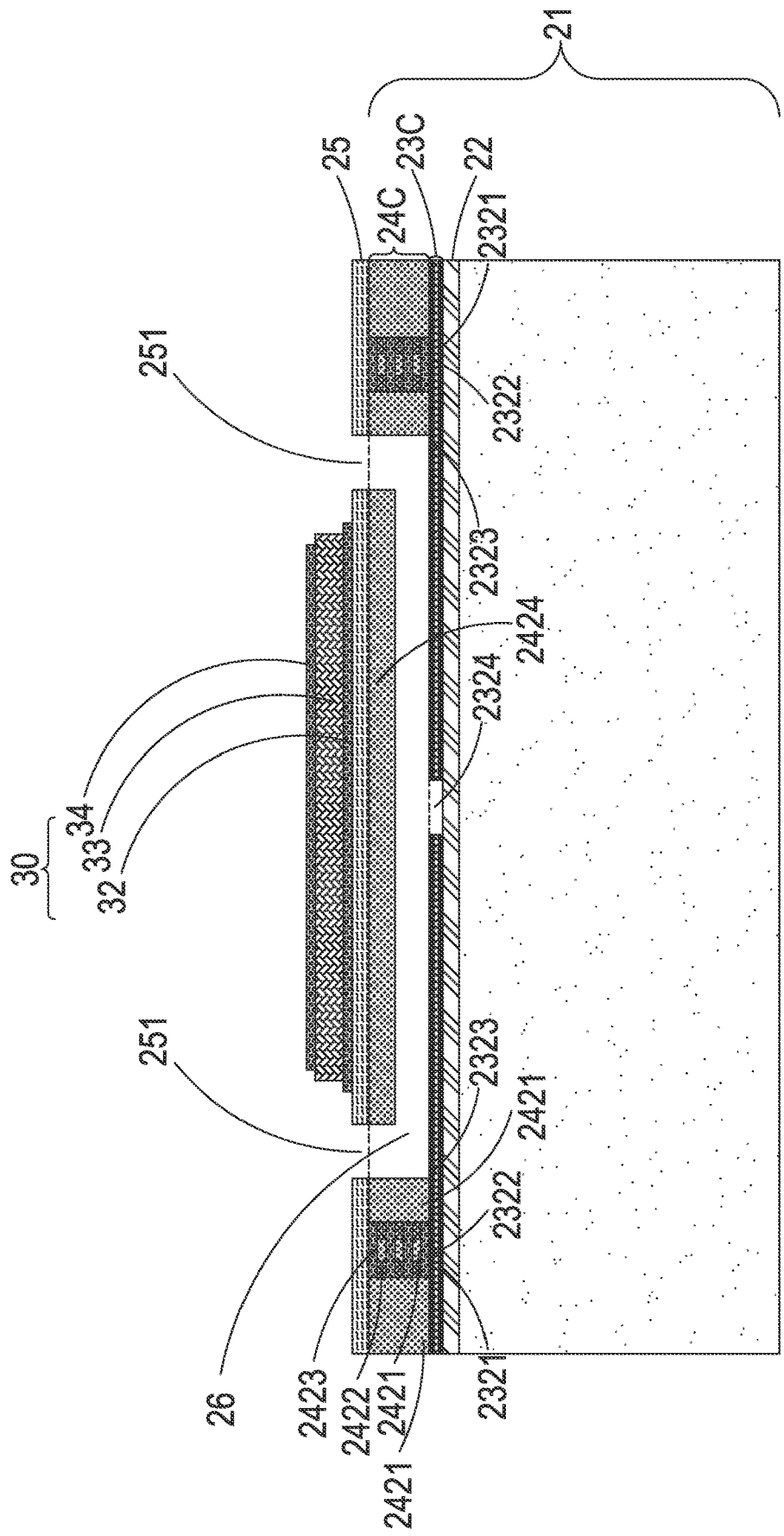
Figure 6E:
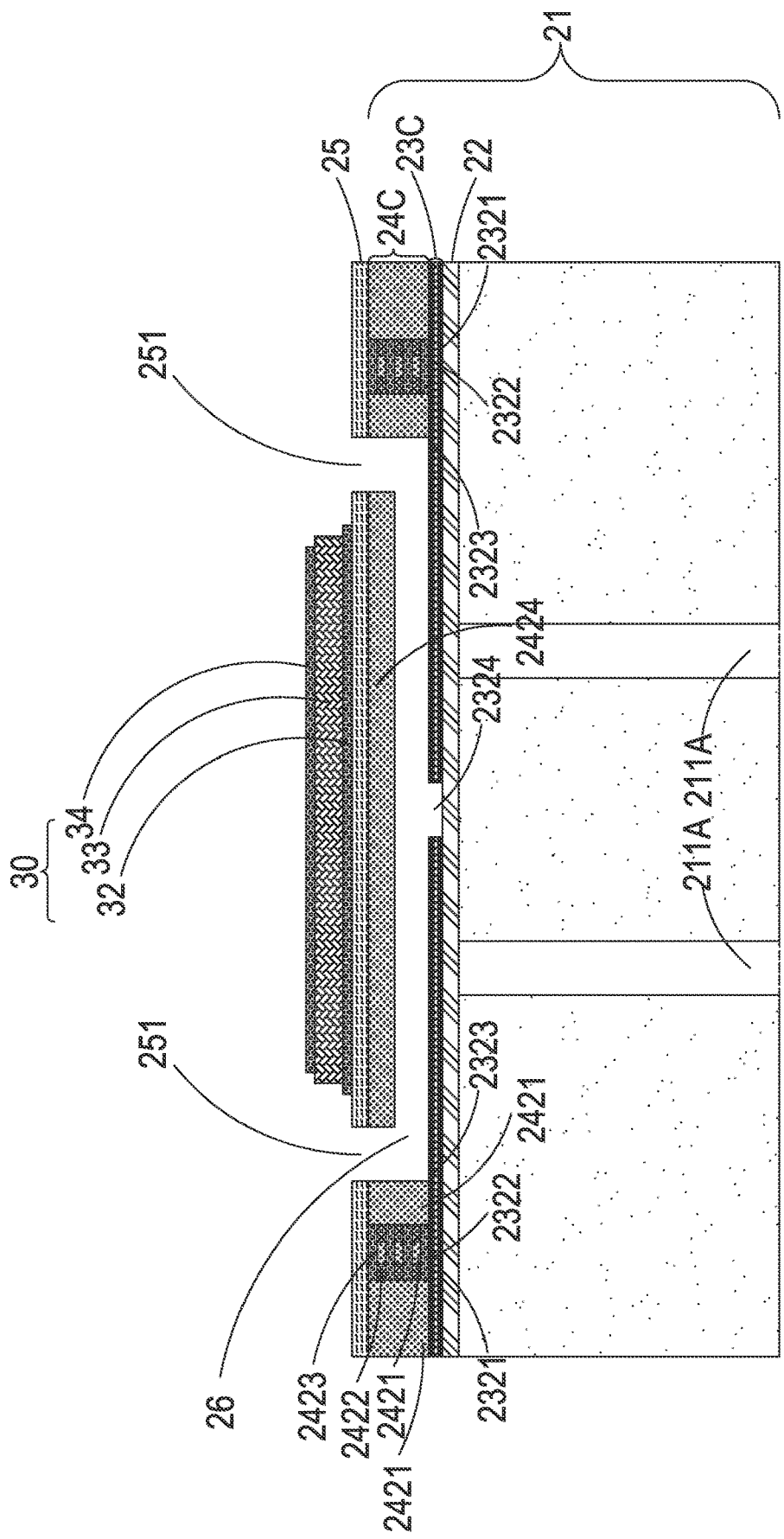
Figure 6F:
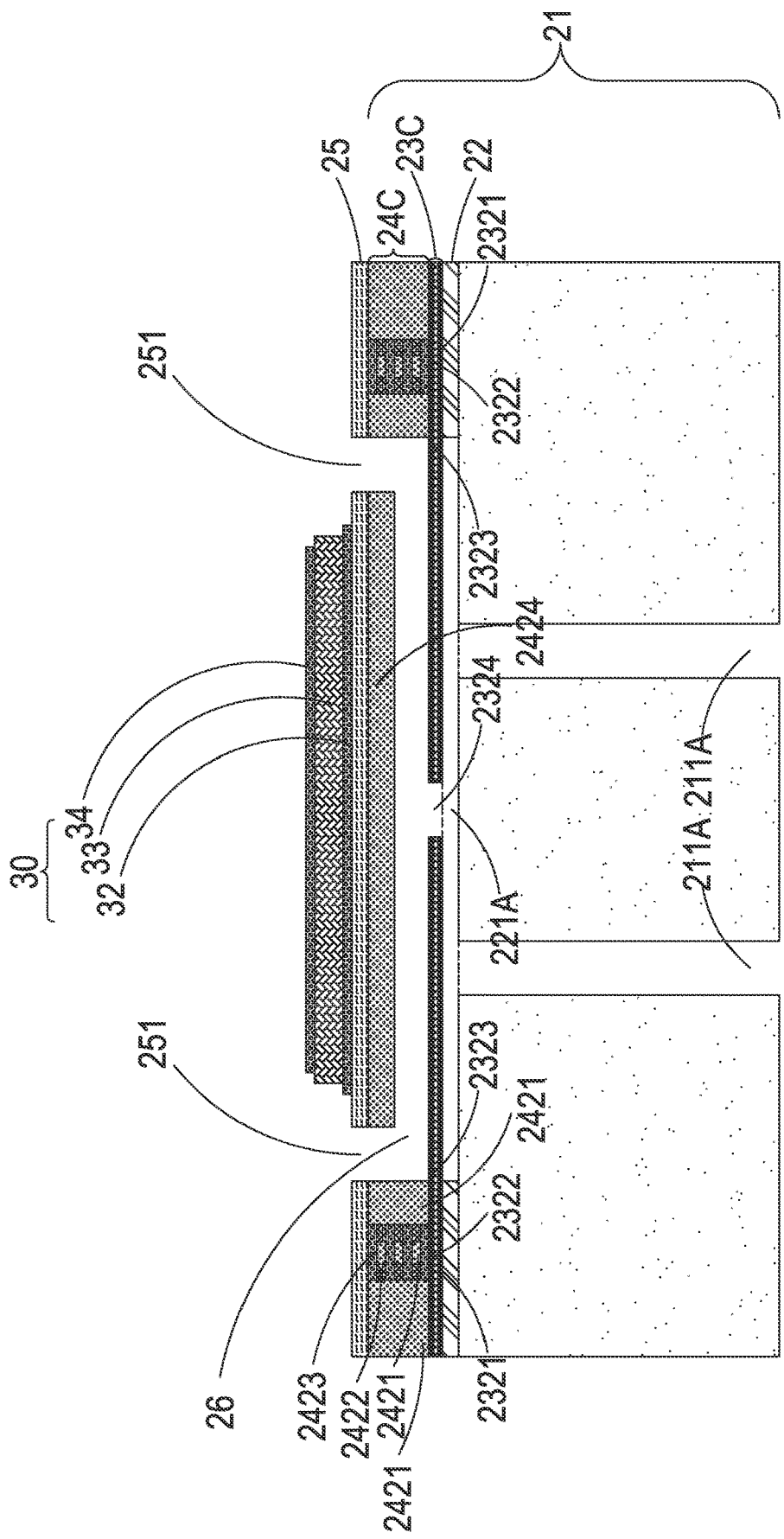
Figure 6G:
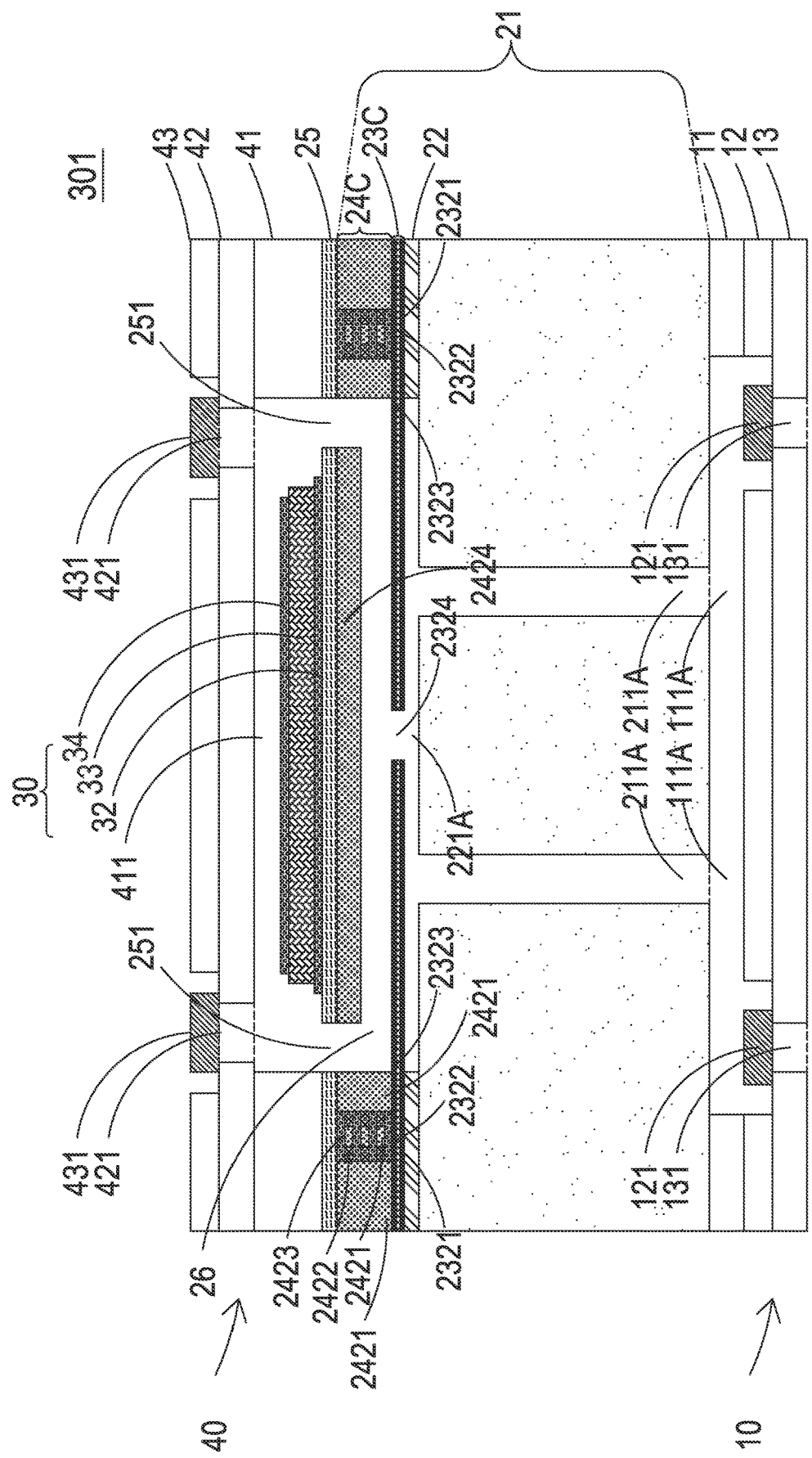
Figure 6H:
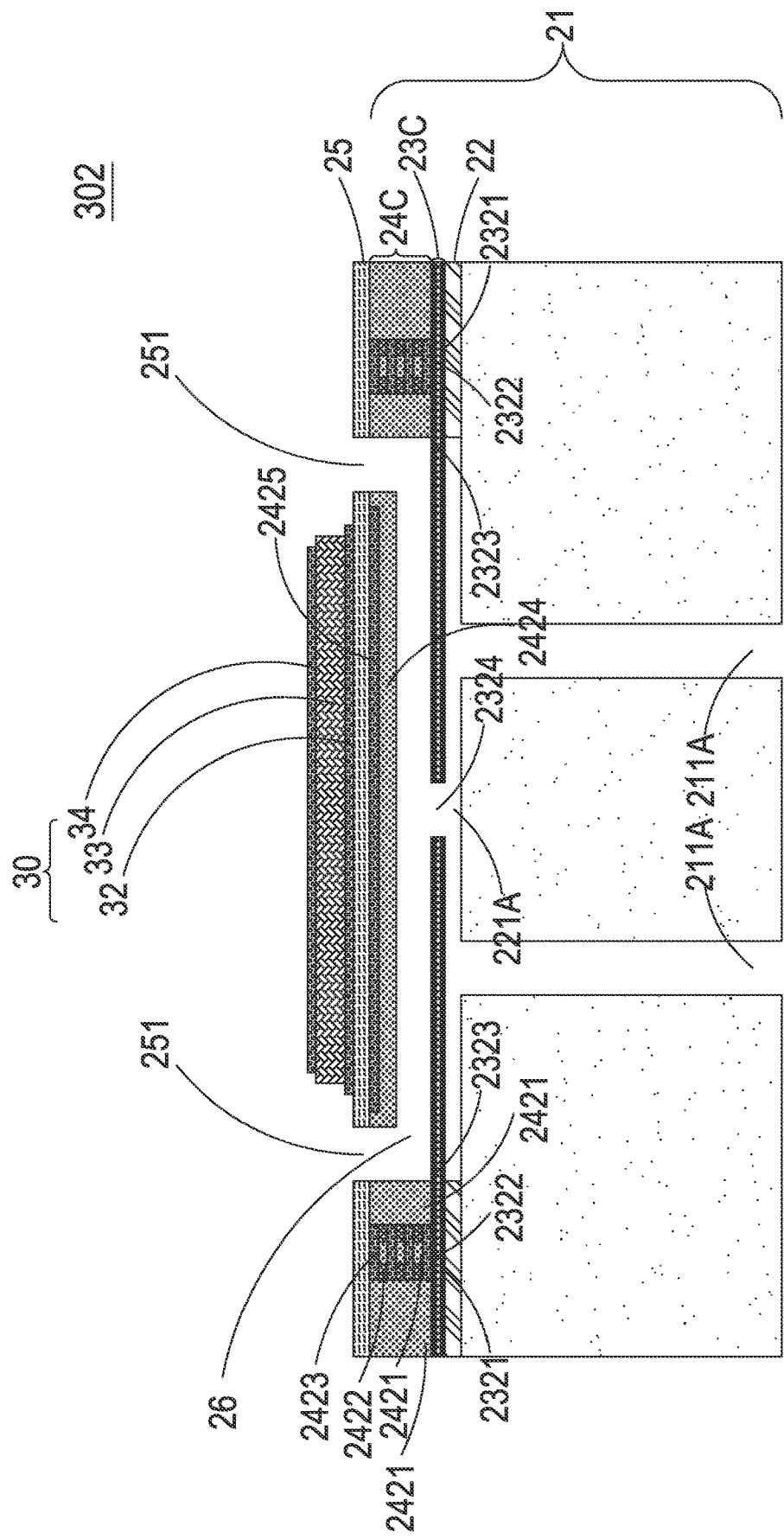
FIG. 6H illustrates a schematic view of the micro fluid actuator of a different implementation of the third embodiment.

Please refer to FIG. 6H. FIG. 6H illustrates the micro fluid actuator 302 of a second implementation of the third embodiment. In the second implementation, the region of the 2P6M oxidation layer middle section 2424 of the main structure 24C further includes a 2P4M metal layer middle section 2425. The main structure 24C is applied with the 2P4M process, so that corresponding patterned structures are respectively formed on at least one 2P4M oxidation layer structure 2421, at least one 2P4M tungsten structure 2422, at least one 2P4M metal structure 2423, a 2P4M oxidation layer middle section 2424, a 2P4M metal layer middle section 2425, and other structures in advance. It is understood that, in the third embodiment of the present disclosure, the placement of the 2P4M metal layer middle section 2425 may be increased or decreased according to design requirements, but embodiments are not limited thereto. In some embodiments or implementations, the placement of the 2P4M metal layer middle section 2425 may be increased or decreased according to design requirements as well.

Based on the above description, the manufacturing method of micro fluid actuator of one or some embodiments of the present disclosure is mainly achieved by 1P6M (or 2P4M) process as well as microelectromechanical systems (MEMS) process. Furthermore, through applying driving powers with different phases and charges to the upper electrode layer and the lower electrode layer respectively, the actuation region drives the first polycrystalline silicon vibration region of the first polycrystalline silicon layer to move up and down, and achieves the operation of fluid transportation. Thus, the industrial value of the present application is very high, so the application is submitted in accordance with the law.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of micro fluid actuator, comprising the steps of:
    providing a substrate applied with a 1P6M process;
    depositing a first protection layer on a first surface of the substrate;
    depositing an actuation region on the first protection layer, wherein a plurality of steps for forming the actuation region comprises sequentially depositing a lower electrode layer, depositing a piezoelectric actuation layer, and depositing an upper electrode layer; and
    applying lithography dry etching to a portion of the first protection layer to produce at least one first protection layer flow channel, further comprising:
    applying wet etching to a portion of a main structure of the substrate to produce a chamber body and a first polycrystalline silicon flow channel region, while a region of a 1P6M oxidation layer middle section of the main structure is not etched;
    applying reactive-ion etching to a portion of a second surface of the substrate to produce at least one substrate silicon flow channel; and
    applying dry etching to a portion of a silicon dioxide layer to produce at least one silicon dioxide flow channel.

2. The manufacturing method of micro fluid actuator according to claim 1, further comprising:
    assembling a lower valve region under the second surface of the substrate and assembling an upper valve region on the first protection layer.

3. The manufacturing method of micro fluid actuator according to claim 1, wherein the region of the 1P6M oxidation layer middle section of the main structure further comprises a 1P6M metal layer middle section.

4. A manufacturing method of micro fluid actuator, comprising the steps of:
    providing a substrate applied with a 1P6M process;
    depositing a first protection layer on a first surface of the substrate;
    depositing an actuation region on the first protection layer, wherein a plurality of steps for forming the actuation region comprises sequentially depositing a lower electrode layer, depositing a piezoelectric actuation layer, and depositing an upper electrode layer; and
    applying lithography dry etching to a portion of the first protection layer to produce at least one first protection layer flow channel, further comprising:
    applying wet etching to a portion of a main structure of the substrate to produce a chamber body, while a region of a 1P6M oxidation layer middle section of the main structure is not etched; and
    applying reactive-ion etching to a portion of a second surface of the substrate to produce at least one substrate silicon flow channel, at least one silicon dioxide flow channel, and at least one first polycrystalline silicon flow channel region.

5. The manufacturing method of micro fluid actuator according to claim 4, wherein the region of the 1P6M oxidation layer middle section of the main structure further comprises a 1P6M metal layer middle section.

6. The manufacturing method of micro fluid actuator according to claim 4, wherein in the step of applying wet etching to a portion of a main structure of the substrate, an oxidation region of the main structure is not etched.

7. A manufacturing method of micro fluid actuator, comprising the steps of:
    providing a substrate, wherein the substrate is a substrate applied with a 2P4M process;
    depositing a first protection layer on a first surface of the substrate;
    depositing an actuation region on the first protection layer, wherein a plurality of steps for forming the actuation region comprises sequentially depositing a lower electrode layer, depositing a piezoelectric actuation layer, and depositing an upper electrode layer; and
    applying lithography dry etching to a portion of the first protection layer to produce at least one first protection layer flow channel, further comprising:
    applying wet etching to a portion of a main structure of the substrate to produce a chamber body, while a region of a 2P4M oxidation layer middle section of the main structure is not etched;
    applying reactive-ion etching to a portion of a second surface of the substrate to produce at least one substrate silicon flow channel; and
    applying dry etching to a portion of a silicon dioxide layer to produce at least one silicon dioxide flow channel.

8. The manufacturing method of micro fluid actuator according to claim 7, further comprising:
    assembling a lower valve region under the second surface of the substrate and assembling an upper valve region on the first protection layer.

9. The manufacturing method of micro fluid actuator according to claim 7, wherein the region of the 2P4M oxidation layer middle section of the main structure further comprises a 2P4M metal layer middle section.

* * * * *